United States Patent
Hashimoto

(10) Patent No.: US 12,095,014 B2
(45) Date of Patent: Sep. 17, 2024

(54) LIGHT-EMITTING DEVICE, SURFACE LIGHT SOURCE, AND METHOD OF MANUFACTURING THE SAME

(71) Applicant: NICHIA CORPORATION, Anan (JP)

(72) Inventor: Toru Hashimoto, Tokushima (JP)

(73) Assignee: NICHIA CORPORATION, Anan (JP)

( * ) Notice: Subject to any disclaimer, the term of this patent is extended or adjusted under 35 U.S.C. 154(b) by 434 days.

(21) Appl. No.: 17/512,489

(22) Filed: Oct. 27, 2021

(65) Prior Publication Data

US 2022/0140209 A1 May 5, 2022

(30) Foreign Application Priority Data

Oct. 29, 2020 (JP) ................................. 2020-181843

(51) Int. Cl.
| | |
|---|---|
| H01L 33/58 | (2010.01) |
| H01L 27/15 | (2006.01) |
| H01L 33/00 | (2010.01) |
| H01L 33/62 | (2010.01) |

(52) U.S. Cl.
CPC ............ *H01L 33/58* (2013.01); *H01L 27/153* (2013.01); *H01L 33/005* (2013.01); *H01L 33/62* (2013.01)

(58) Field of Classification Search
CPC ..... H01L 33/58; H01L 27/153; H01L 33/005; H01L 33/62; H01L 33/507; H01L 33/56; H01L 33/54
See application file for complete search history.

(56) References Cited

U.S. PATENT DOCUMENTS

| | | | |
|---|---|---|---|
| 8,301,002 B2 | 10/2012 | Shani | |
| 2005/0265029 A1 | 12/2005 | Epstein et al. | |
| 2012/0074441 A1* | 3/2012 | Seo | H01L 33/42 |
| | | | 257/E33.068 |
| 2012/0217525 A1* | 8/2012 | Chan | H01L 33/486 |
| | | | 257/E33.068 |
| 2013/0187178 A1 | 7/2013 | Tischler | |
| 2017/0179344 A1* | 6/2017 | Matsuda | H01L 33/0095 |
| 2017/0358716 A1* | 12/2017 | Park | H01L 33/486 |

(Continued)

FOREIGN PATENT DOCUMENTS

| | | |
|---|---|---|
| JP | H10-256432 A | 9/1998 |
| JP | H11-145341 A | 5/1999 |

(Continued)

*Primary Examiner* — S M Sohel Imtiaz
(74) *Attorney, Agent, or Firm* — Foley & Lardner LLP

(57) ABSTRACT

A light-emitting device includes: a light-emitting element having an upper surface, a lower surface opposite to the upper surface, and lateral surfaces between the upper surface and the lower surface; a plurality of electrodes electrically connected to the light-emitting element and disposed on the lower surface of the light-emitting element; and a resin member covering the upper surface, the lower surface, and the lateral surfaces of the light-emitting element, the resin member having an upper surface, a lower surface opposite to the upper surface, and lateral surfaces between the upper surface and the lower surface. A portion of each of the electrodes is exposed at the lower surface of the resin member. A plurality of grooves are defined in the lower surface of the resin member, each of the grooves extending from a position apart from the electrode to an outer edge of the lower surface of the resin member.

20 Claims, 17 Drawing Sheets

(56) References Cited

U.S. PATENT DOCUMENTS

| | | | | |
|---|---|---|---|---|
| 2019/0181074 A1* | 6/2019 | Huang | ............. | H01L 23/49513 |
| 2019/0181305 A1 | 6/2019 | Huang | | |
| 2019/0207070 A1* | 7/2019 | Richter | .................. | H01L 33/56 |
| 2019/0294004 A1* | 9/2019 | Hashimoto | ........ | G02F 1/133611 |
| 2020/0274042 A1* | 8/2020 | Lee | ......................... | H01L 33/60 |
| 2022/0085258 A1* | 3/2022 | Damborsky | ............ | H01L 33/52 |
| 2022/0199862 A1* | 6/2022 | Liang | .................... | H01L 21/683 |

FOREIGN PATENT DOCUMENTS

| | | | |
|---|---|---|---|
| JP | 2015-506591 | A | 3/2015 |
| JP | 2017-118098 | A | 6/2017 |
| JP | 2018-182347 | A | 11/2018 |
| JP | 3219487 | U | 12/2018 |
| JP | 3219881 | U | 1/2019 |
| JP | 2019-175846 | A | 10/2019 |
| JP | 2020-035938 | A | 3/2020 |
| JP | 2020-194973 | A | 12/2020 |
| KR | 2009-0117419 | A | 11/2009 |
| WO | WO-2013/112691 | A2 | 8/2013 |

* cited by examiner

LIGHT-EMITTING DEVICE, SURFACE LIGHT SOURCE, AND METHOD OF MANUFACTURING THE SAME

CROSS REFERENCE TO RELATED APPLICATION

This application claims priority to Japanese Patent Application No. 2020-181843, filed on Oct. 29, 2020, the entire contents of which are hereby incorporated by reference.

BACKGROUND

The present disclosure relates to a light-emitting device, a surface light source, and a method of manufacturing the same.

Light-emitting modules in which light-guiding plates and light-emitting elements such as light-emitting diodes are combined have been widely used for surface light sources such as backlights for liquid-crystal display devices. For such a surface light source, a constitution in which light-emitting devices are disposed inside respective through holes defined in a light-guiding plate has been proposed (for example, see KRA 10-2009-0117419).

SUMMARY

In order to electrically connect the light-emitting device disposed inside the through hole of the light-guiding plate to an external circuit, a structure may be employed in which the light-guiding plate and the light-emitting device are disposed on a wiring board.

An object of certain embodiments of the present disclosure is to provide a light-emitting device in which reliability of an electrical connection between a light-emitting device and a wiring board can be improved, a surface light source using the light-emitting device, and a method of manufacturing the light-emitting device.

In an embodiment of the present invention, a light-emitting device includes: a light-emitting element having a first upper surface, a first lower surface opposite to the first upper surface, and first lateral surfaces between the first upper surface and the first lower surface; electrodes electrically connected to the light-emitting element and disposed on the first lower surface of the light-emitting element; and a resin member covering the first upper surface, the first lower surface, and the first lateral surfaces of the light-emitting element, the resin member having a second upper surface, a second lower surface opposite to the second upper surface, and second lateral surfaces between the second upper surface and the second lower surface. A portion of each of the electrodes is exposed in the second lower surface of the resin member. Grooves are defined in the second lower surface of the resin member, each of the grooves extending from a position apart from the electrode to an outer edge of the second lower surface of the resin member.

According to certain embodiments of the present invention, reliability of an electrical connection between a light-emitting device and a wiring board can be improved.

DETAILED DESCRIPTION

Figure 1A:
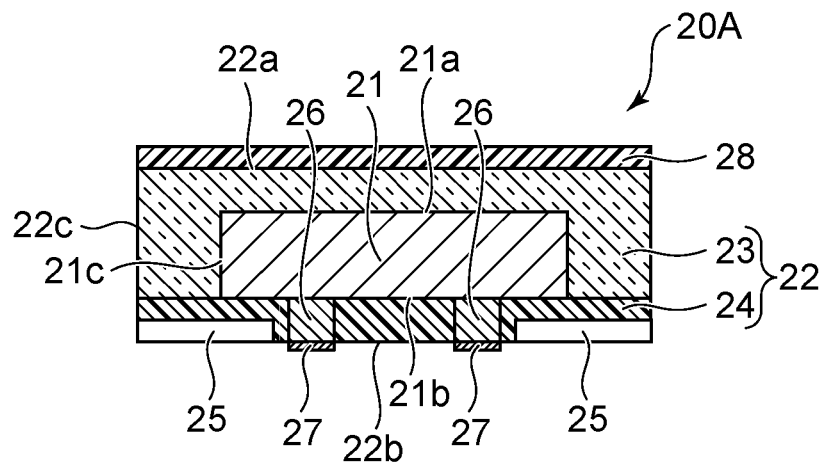
FIG. 1A is a schematic cross-sectional view of a light-emitting device of a first embodiment of the present invention.

Certain embodiments will be described below referring to the accompanying drawings. The drawings schematically illustrate certain embodiments of the present invention. In the drawings, the scales, the distances, the positional relationships, and the like of members may be exaggerated, or illustration of portions of members may be omitted. Also, cross-sectional end views showing only cut surfaces of members may be used for cross-sectional views. In the drawings, the same reference numeral is applied to the same component.

First Embodiment

Figure 1B:
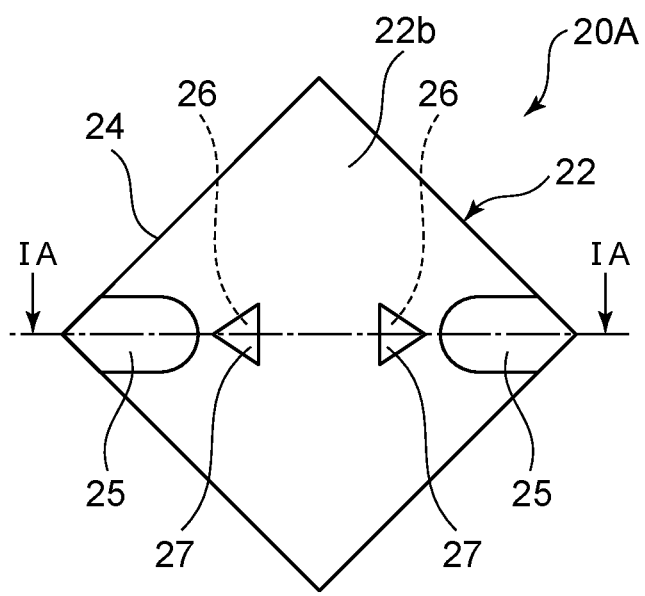
FIG. 1B is a schematic bottom view of the light-emitting device shown in FIG. 1A.

FIG. 1A is a schematic cross-sectional view of a light-emitting device 20A of a first embodiment of the present invention. FIG. 1B is a schematic bottom view of the light-emitting device 20A shown in FIG. 1A. FIG. 1A is a schematic cross-sectional view taken along the line IA-IA of FIG. 1B.

The light-emitting device 20A includes a light-emitting element 21, electrodes 26, and a resin member 22. The light-emitting device 20A may also include a first light adjusting member 28 according to a desired light distribution. In other examples, the first light adjusting member 28 is not disposed on the resin member 22; in other words, the upper surface of the resin member 22 can serve as the upper surface of the light-emitting device 20A.

The light-emitting element 21 has a first upper surface 21a, a first lower surface 21b opposite to the first upper surface 21a, and first lateral surfaces 21c between the first upper surface 21a and the first lower surface 21b.

The light-emitting element 21 includes a semiconductor layered body. For example, the semiconductor layered body includes a supporting substrate such as a sapphire or gallium nitride substrate, an n-type semiconductor layer and a p-type semiconductor layer that are disposed on the supporting substrate, a light-emitting layer between the n-type semiconductor layer and the p-type semiconductor layer, and an n-side electrode and a p-side electrode electrically connected respectively to the n-type semiconductor layer and the p-type semiconductor layer. The semiconductor layered body in which the supporting substrate has been removed may be used.

The light-emitting layer may have a structure with a single active layer, such as a double heterostructure and a single quantum well (SQW) structure, or a structure with a group of active layers, such as a multiple quantum well (MQW) structure. The light-emitting layer is configured to emit visible light or ultraviolet light. The light-emitting layer can be configured to emit blue to red light as the visible light. The semiconductor layered body including such a light-emitting layer can contain, for example, $In_xAl_yGa_{1-x-y}N$ ($0 \leq x$, $0 \leq y$, and $x+y \leq 1$).

The semiconductor layered body can include at least one light-emitting layer configured to emit light having the emission color described above. For example, the semiconductor layered body may include one or more light-emitting layers between the n-type semiconductor layer and the p-type semiconductor layer or may include a repetitive structure including the n-type semiconductor layer, the light-emitting layer, and the p-type semiconductor layer in order. In the case in which the semiconductor layered body includes a plurality of light-emitting layers, light-emitting layers emitting different emission colors may be included, or light-emitting layers emitting the same emission color may be included. The term "the same emission color" as used herein includes emission colors that can be regarded as the same color for use, and, for example, allows for variations in dominant wavelength of about several nanometers. The combination of emission colors can be appropriately selected. In the case in which the semiconductor layered body includes two light-emitting layers, examples of the combination of emission colors include blue and blue, green and green, red and red, ultraviolet and ultraviolet, blue and green, blue and red, and green and red. The light-emitting layers may include a plurality of active layers configured to emit different emission colors or a plurality of active layers configured to emit the same emission color.

Positive and negative electrodes 26 electrically connected respectively to the p-side electrode and the n-side electrode of the light-emitting element 21 are disposed on the first lower surface 21b of the light-emitting element 21.

The resin member 22 is disposed over the first upper surface 21a, the first lower surface 21b, and the first lateral surfaces 21c of the light-emitting element 21 to cover the first upper surface 21a, the first lower surface 21b, and the first lateral surfaces 21c. The resin member 22 has a second upper surface 22a, a second lower surface 22b opposite to the second upper surface 22a, and a second lateral surfaces 22c between the second upper surface 22a and the second lower surface 22b.

In the present embodiment, the resin member 22 includes a first resin portion 23 and a second resin portion 24. The resin member 22 may be constituted of only the first resin portion 23 or the second resin portion 24. Alternatively, the resin member 22 may further include a resin portion in addition to the first resin portion 23 and the second resin portion 24.

The first resin portion 23 is disposed on the first upper surface 21a and the first lateral surfaces 21c of the light-emitting element 21 to cover the first upper surface 21a and the first lateral surfaces 21c. The first resin portion 23 may also cover the first lower surface 21b of the light-emitting element 21.

When the resin member 22 is constituted of only the first resin portion 23, the first resin portion 23 is disposed over the first upper surface 21a, the first lower surface 21b, and the first lateral surfaces 21c of the light-emitting element 21 to cover the first upper surface 21a, the first lower surface 21b, and the first lateral surfaces 21c. When the resin member 22 is constituted of only the second resin portion 24, the second resin portion 24 is disposed on the first lower surface 21b of the light-emitting element to cover the first lower surface 21b.

The first resin portion 23 protects the light-emitting element 21 and has the function of wavelength conversion, light diffusion, or the like depending on particles added to the first resin portion 23. More specifically, the first resin portion 23 contains a light-transmissive resin and may further contain a phosphor. Examples of the light-transmissive resin include silicone resins, phenolic resins, epoxy resins, and acrylic resins. Examples of the phosphor include yttrium-aluminum-garnet-based phosphors (such as $Y_3(Al,Ga)_5O_{12}:Ce$), lutetium-aluminum-garnet-based phosphors (such as $Lu_3(Al,Ga)_5O_{12}:Ce$), terbium-aluminum-garnet-based phosphors (such as $Tb_3(Al,Ga)_5O_{12}:Ce$), β-SiAlON phosphors (such as $(Si,Al)_3(O,N)_4:Eu$), α-SiAlON phosphors (such as $Mz(Si,Al)_{12}(O,N)_{16}$ (where $0<z\leq2$, M is Li, Mg, Ca, Y, or a lanthanoid element except for La and Ce)), nitride-based phosphors such as CASN-based phosphors (such as $CaAlSiN_3:Eu$) and SCASN-based phosphors (such as $(Sr,Ca)AlSiN_3:Eu$), fluoride phosphors such as KSF-based phosphors (such as $K_2SiF_6:Mn$) and MGF-based phosphors (such as $3.5MgO \cdot 0.5MgF_2 \cdot GeO_2:Mn$), and quantum-dot phosphors. For the phosphor added to the first resin portion 23, a single type of phosphor or a plurality of types of phosphors may be used.

The second resin portion 24 is disposed on the first lower surface 21b of the light-emitting element 21 and the lower surface of the first resin portion 23 to cover the first lower surface 21b of the light-emitting element 21 and the lower surface of the first resin portion 23. The lower surface of the second resin portion 24 serves as the second lower surface 22b of the resin member 22.

The second resin portion 24 is a light-reflective portion configured to reflect light emitted from the light-emitting element 21. In the case in which the first resin portion 23 contains a phosphor, the second resin portion 24 also reflects light emitted from the phosphor.

Examples of the second resin portion 24 include a silicone resin, a phenolic resin, an epoxy resin, and an acrylic resin containing a light-diffusing agent such as particles of $TiO_2$, $SiO_2$, $Al_2O_3$, ZnO, or glass.

The second resin portion 24 covers lateral surfaces of the electrodes 26. The lower surfaces of the electrodes 26 are not covered with the second resin portion 24 but are exposed from the second resin portion 24. A metal film 27 can be further disposed on the lower surface of each of the electrodes 26. For example, the material of the electrodes 26 is Cu, and each metal film 27 contains an Au film. Each metal film 27 can further include a Ni film disposed between the lower surface of a respective electrode 26 and the Au film.

Each electrode 26 and a respective metal film 27 have a triangular shape in a plan view. The electrode 26 and the metal film 27 may have a circular shape, an elliptic shape, or a polygonal shape such as a quadrangular shape in a plan view.

Grooves 25 are defined in the lower surface of the second resin portion 24 constituting the second lower surface 22b of the resin member 22. Each of the grooves 25 has a longitudinal portion extending in an longitudinal direction and a short portion extending in a short direction orthogonal to the longitudinal direction in a plan view, and the longitudinal portion of the groove 25 extends from a position apart from the electrode 26 to the outer edge of the second lower surface 22b of the resin member 22. The base surface of the groove 25 defined in the second resin portion 24 does not reach the first lower surface 21b of the light-emitting element 21 or the lower surface of the first resin portion 23. In other words, the base surface of the groove 25 defined in the second resin portion 24 is in contact with the second resin portion 24. An end of the groove 25 in the longitudinal direction of the groove 25 is not in contact with the electrode 26. In other words, the end of the groove 25 in the longitudinal direction of the groove 25 is apart from the electrode 26 at a distance of preferably 20 μm or more and 100 μm or less, more preferably 50 μm or more and 80 μm or less. The second lower surface 22b of the resin portion 22 is located between the end of the groove 25 and the electrode 26 in a plan view. This structure allows for reducing deterioration of the electrodes 26 due to heat generated when the grooves 25 are formed. More specifically, oxidation of the surfaces of the electrodes 26 can be reduced. Further, deformation and breakdowns of the electrodes 26 due to stress caused when the grooves 25 are formed can be prevented.

The second lower surface 22b of the resin member 22 has a quadrangular shape in a plan view. The outer edge of the second lower surface 22b that the other end of the groove 25 in the longitudinal direction reaches includes a corner of the second lower surface 22b. For example, a pair of electrodes 26 and the two grooves 25 each corresponding to a respective one of the pair of electrodes 26 are aligned on a diagonal of the second lower surface 22b in a plan view. One of the grooves 25 extends from a position apart from one of the electrodes 26 to a corner of the second lower surface 22b, and the other of the grooves 25 extends from a position apart from the other of the electrodes 26 to another corner of the second lower surface 22b. The grooves 25 are not located between the pair of electrodes 26. The shortest distance (separation distance from the electrode 26) between one end of the groove 25 and the electrode 26 is shorter than the shortest distance (length of the groove 25) between the one and the other ends of the groove 25. This structure allows for increasing electroconductive paste to be supplied to the grooves 25. Accordingly, the light emitting device 20A can be firmly fixed to a supporting member 200 by the electroconductive paste. The groove 25 in the example herein is not bent but rather extends straight from the position apart from the electrode 26 to the outer edge of the second lower surface 22b of the resin member 22. Alternatively, the groove 25 may not only extend straight but rather may also be bent.

In a cross-sectional view of the groove 25 in the short direction, the shape constituted of the bottom surface and the lateral surface of the groove 25 defined by the second resin portion 24 is preferably curved. The curved shape allows for improving the flow of the electroconductive paste in the longitudinal direction inside the groove 25 when the electroconductive paste is supplied, which allows air to escape to a second hole 13 through the groove 25. The groove 25 preferably has a width in the short direction of 20 μm or more and 50 μm or less in a cross-sectional view of the groove 25 taken along the short direction of the groove 25. The groove 25 preferably has a depth of 20 μm or more and 50 μm or less.

The first light adjusting member 28 is disposed on the upper surface of the first resin portion 23 serving as the second upper surface 22a of the resin member 22. The first light adjusting member 28 controls the amount and direction of emission of light emitted from the second upper surface 22a of the resin member 22. The first light adjusting member 28 is adapted to reflect and transmit light emitted from the light-emitting element 21 and the phosphor. A portion of light emitted from the second upper surface 22a of the resin member 22 is reflected at the first light adjusting member 28, and another portion of the light is transmitted through the first light adjusting member 28. For example, the transmittance of the first light adjusting member 28 is preferably 1% or more and 50% or less, more preferably 3% or more and 30% or less. With such transmittance, the luminance directly above the light-emitting device 20A can be reduced, which allows for reducing variations in luminance in a plane of a surface light source 300 described below in which the light-emitting device 20A is incorporated.

The first light adjusting member 28 can be constituted of a light-transmissive resin and a light-diffusing agent and the like contained in the light-transmissive resin. Examples of the light-transmissive resin include a silicone resin, a phenolic resin, an epoxy resin, and an acrylic resin. Examples of the light-diffusing agent include particles of $TiO_2$, $SiO_2$, $Al_2O_3$, ZnO, or glass. Examples of the first light adjusting member 28 include a metal member made of Al or Ag and a dielectric multilayer film.

Figure 2:
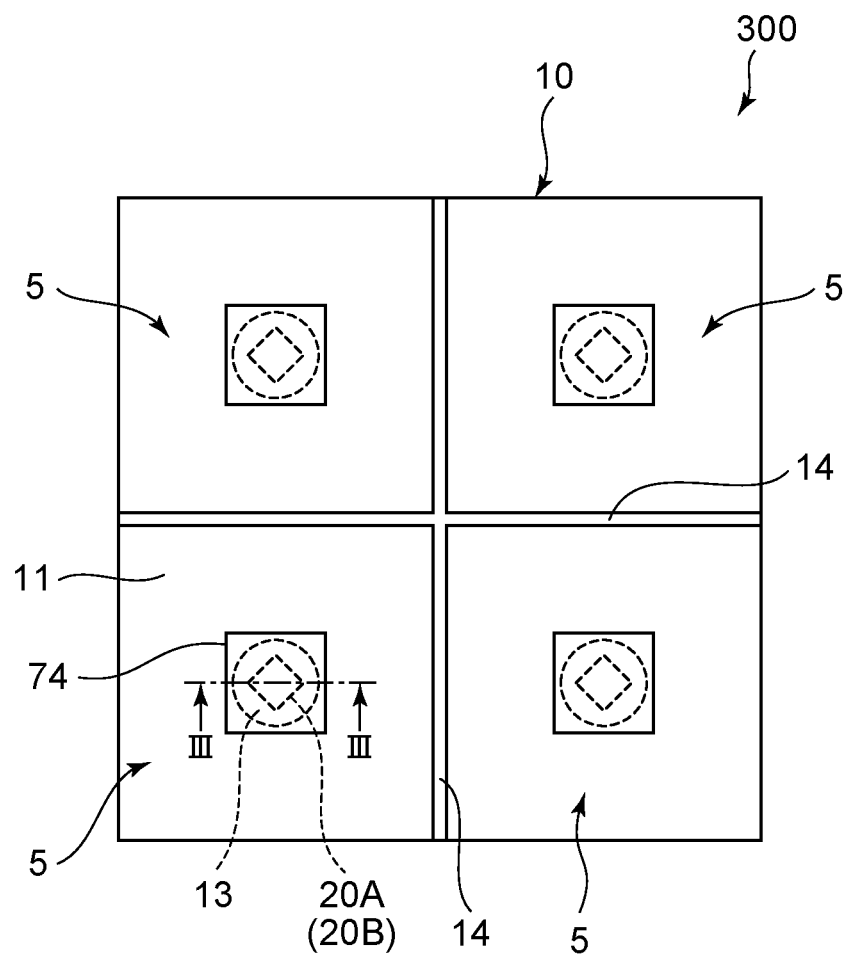
FIG. 2 is a schematic plan view of a surface light source of the first embodiment of the present invention.

FIG. 2 is a schematic plan view of the surface light source 300 including the light-emitting device 20A described above. FIG. 2 schematically shows the light-exiting surface of the surface light source 300 in a plan view.

The surface light source 300 includes the light-emitting device 20A and a light-guiding plate 10. The light-guiding plate 10 is adapted to transmit light emitted from the light-emitting device 20A. The light emitted from the light-emitting device 20A includes at least light emitted from the light-emitting element 21. When the light-emitting device 20A contains a phosphor, the light emitted from the light-emitting device 20A also includes light emitted from the phosphor. For example, the light-guiding plate 10 preferably has a transmittance of 80% or more, more preferably 90% or more with respect to the light emitted from the light-emitting device 20A.

Examples of the material of the light-guiding plate 10 include thermoplastic resins such as acrylic, polycarbonates, cyclic polyolefins, poly(ethylene terephthalate), and polyesters, thermosetting resins such as epoxies and silicones, and glass.

The light-guiding plate 10 preferably has a thickness of, for example, 200 μm or more and 800 μm or less. The light-guiding plate 10 may be constituted of a single layer or a layered body of a plurality of layers in the thickness direction. In the case in which the light-guiding plate 10 is constituted of a layered body, light-transmissive adhesive members may be disposed between respective layers. Different types of main materials may be used for the layers of the layered body. Examples of a material of the adhesive member include thermoplastic resins such as acrylic, polycarbonates, cyclic polyolefins, poly(ethylene terephthalate), and polyesters and thermosetting resins such as epoxies and silicones.

The light-guiding plate 10 is divided into a plurality of light-emitting regions 5 by dividing grooves 14. The dividing grooves 14 are in a grid-like shape in a plan view and divide the light-guiding plate 10 such that at least one light-emitting device 20A is located in a single light-emitting region 5. For example, FIG. 2 schematically shows the surface light source 300 including four light-emitting regions 5 arranged in a two-by-two matrix. Each of the light-emitting regions 5 divided by the dividing grooves 14 can be used as, for example, a unit of driving of local dimming. The number of light-emitting regions 5 constituting the surface light source 300 is not limited to the number shown in FIG. 2.

Figure 3:
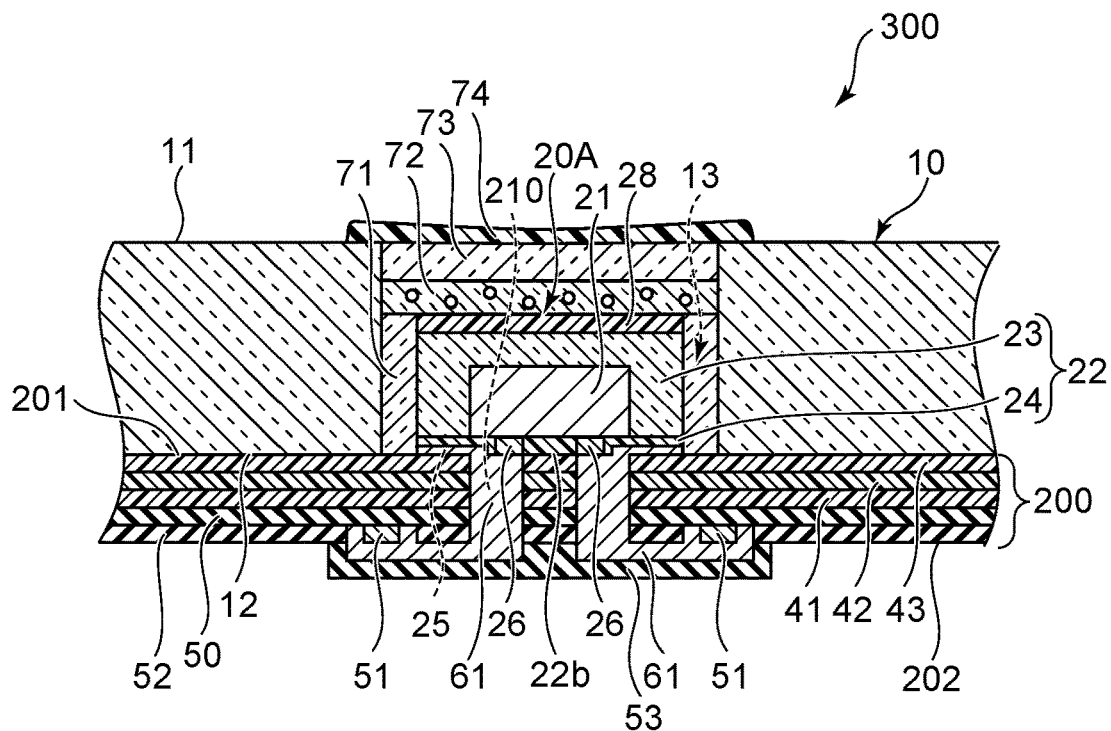
FIG. 3 is a schematic cross-sectional view taken along the line of FIG. 2.

FIG. 3 is a schematic cross-sectional view taken along the line of FIG. 2.

The light-guiding plate 10 has a first main surface 11 serving as the light-exiting surface of the surface light source 300 and a second main surface 12 opposite to the first main surface 11. The light-guiding plate 10 defines the second hole 13 in which the light-emitting device 20A is disposed. The second hole 13 is a through hole extending from the first main surface 11 to the second main surface 12. For example, the second hole 13 can be circular in a plan view as shown in FIG. 2. Alternatively, the second hole 13 may have, for example, an elliptic shape or a polygonal shape such as a triangular shape, a quadrangular shape, a hexagonal shape, and an octagonal shape in a plan view.

The surface light source 300 further includes the supporting member 200. The supporting member 200 has a third upper surface 201 and a third lower surface 202 opposite to the third upper surface 201. The light-guiding plate 10 is disposed on the supporting member 200 such that the second main surface 12 faces the third upper surface 201 of the supporting member 200. The light-emitting device 20A is disposed on the supporting member 200 inside the second hole 13 of the light-guiding plate 10.

The surface light source 300 can further include a first light-transmissive member 71, a wavelength conversion member 72, a second light-transmissive member 73, and a second light adjusting member 74. The first light-transmissive member 71, the wavelength conversion member 72, and the second light-transmissive member 73 are disposed inside the second hole 13 of the light-guiding plate 10.

The first light-transmissive member 71 and the second light-transmissive member 73 is adapted to transmit light emitted from the light-emitting device 20A. For example, the same resin as the light-guiding plate 10 or a resin with a small difference in refractive index from the material of the light-guiding plate 10 can be used.

The first light-transmissive member 71 is disposed between a lateral surface of the light-emitting device 20A and a lateral surface of the second hole 13 of the light-guiding plate 10. The first light-transmissive member 71 is preferably disposed such that a space such as an air layer is not formed between the lateral surface of the light-emitting device 20A and the first light-transmissive member 71 and between the lateral surface of the second hole 13 and the first light-transmissive member 71. This structure allows light from the light-emitting device 20A to be easily guided to the light-guiding plate 10.

The wavelength conversion member 72 covers the upper surface of the light-emitting device 20A. The wavelength conversion member 72 also covers the upper surface of the first light-transmissive member 71. The wavelength conversion member 72 is a light-transmissive resin member containing a phosphor for adjusting the color of the light-emitting device 20A.

The second light-transmissive member 73 covers the upper surface of the wavelength conversion member 72. The upper surface of the second light-transmissive member 73 can be flat. Alternatively, the upper surface of the second light-transmissive member 73 can be a concave or convex curved surface.

The second light adjusting member 74 is located on the second light-transmissive member 73. The second light adjusting member 74 is adapted to reflect and transmit light emitted from the light-emitting device 20A. The second light adjusting member 74 can be constituted of a light-transmissive resin and a light-diffusing agent and the like contained in the light-transmissive resin. Examples of the light-transmissive resin include a silicone resin, a phenolic resin, an epoxy resin, and an acrylic resin. Examples of the light-diffusing agent include particles of $TiO_2$, $SiO_2$, $Al_2O_3$, ZnO, or glass.

The second light adjusting member 74 can be disposed to cover the whole or a portion of the upper surface of the second light-transmissive member 73. The second light adjusting member 74 can extend to the upper surface of the second light-transmissive member 73 and the surrounding portion of the first main surface 11 of the light-guiding plate 10.

The second light adjusting member 74 is disposed at a position overlapping with the light-emitting device 20A in a plan view as shown in FIG. 2. In the example shown in FIG. 2, in a plan view, the light-emitting device 20A has a quadrangular shape, and the second light adjusting member 74 has a quadrangular shape larger than the quadrangular shape of the light-emitting device 20A. The second light adjusting member 74 can have a circular shape or a polygonal shape such as a triangular shape, a hexagonal shape, or an octagonal shape in a plan view.

The second light adjusting member 74 reflects a portion of light emitted directly upward from the light-emitting device 20A and transmits another portion of the light. Accordingly, luminance in a region directly above the light-emitting device 20A can be prevented from being excessively higher than the luminance of the other regions on the first main surface 11 serving as the light-exiting surface (light-emission surface) of the surface light source 30. That is, unevenness in luminance of light emitted from a single light-emitting region 5 divided by the dividing grooves 14 can be reduced.

The second light adjusting member 74 preferably has a thickness of 0.005 mm or more and 0.2 mm or less, further preferably 0.01 mm or more and 0.075 mm or less. The reflectance of the second light adjusting member 74 is preferably lower than the reflectance of the first light adjusting member 28 of the light-emitting device 20A, and the reflectance with respect to light emitted from the light-emitting device 20A is, for example, preferably 20% or more and 90% or less, further preferably 30% or more and 85% or less.

The second light-transmissive member 73 is disposed between the second light adjusting member 74 and the first light adjusting member 28. The second light-transmissive member 73 has a higher transmittance for light emitted from the light-emitting device 20A than the first light adjusting member 28 and the second light adjusting member 74. The transmittance of the second light-transmissive member 73 with respect to light emitted from the light-emitting device 20A can be twice or more and 100 times or less as high as the transmittance of the first light adjusting member 28 and the transmittance of the second light adjusting member 74 in the range of 100% or less. With such a transmittance, the region directly above the light-emitting device 20A can be prevented from being excessively bright or excessively dark, so that unevenness in luminance in the light-exiting surface of each light-emitting region 5 can be reduced.

The supporting member 200 includes a wiring board 50, a first adhesive member 41, a light-reflective sheet 42, and a second adhesive member 43. The first adhesive member 41, the light-reflective sheet 42, and the second adhesive member 43 are disposed in order on the wiring board 50 in this order.

The first adhesive member 41 is disposed between the wiring board 50 and the light-reflective sheet 42 to bond the wiring board 50 and the light-reflective sheet 42 together.

The second adhesive member 43 is disposed between the light-reflective sheet 42 and the second main surface 12 of the light-guiding plate 10 to bond the light-reflective sheet 42 and the light-guiding plate 10 together. The light-emitting device 20A is disposed on the second adhesive member 43 inside the second hole 13 of the light-guiding plate 10.

The second adhesive member 43 transmits light emitted from the light-emitting device 20A. Examples of the first adhesive member 41 and the second adhesive member 43 include epoxy resins, acrylic resins, and cyclic polyolefin resins.

The light-reflective sheet 42 is disposed below the second main surface 12 of the light-guiding plate 10 and below the light-emitting device 20A. The light-reflective sheet 42 is adapted to reflect light emitted from the light-emitting device 20A. For example, a resin member containing a large number of air bubbles or a resin member containing a light-diffusing agent can be used for the light-reflective sheet 42. Examples of a material of the resin member include poly(ethylene terephthalate) (PET) resins, cyclic polyolefin resins, acrylic resins, silicone resins, urethane resins, and epoxy resins. Examples of the light-diffusing agent include $SiO_2$, $CaF_2$, $MgF_2$, $TiO_2$, $Nb_2O_5$, $BaTiO_3$, $Ta_2O_5$, $Zr_2O_3$, ZnO, $Y_2O_3$, $Al_2O_3$, MgO, and $BaSO_4$.

The wiring board 50 includes an insulating base member and at least one wiring layer. The wiring board 50 may include two or more wiring layers layered in the thickness direction of the wiring board 50. The upper surface of the wiring board 50 is bonded to the first adhesive member 41. Connecting portions 51, which are portions of the wiring layer, are located on the lower surface of the wiring board 50. The lower surface of the wiring board 50 is covered with an insulating film 52. The connecting portions 51 are not covered with the insulating film 52 but rather are exposed from the insulating film 52. The lower surface of the insulating film 52 serves as the third lower surface 202 of the supporting member 200. The supporting member 200 includes the connecting portions 51 of the wiring layer on the third lower surface 202 side.

Connecting members 61 are disposed below the light-emitting device 20A. The connecting members 61 are located inside first holes 210 extending through the third upper surface 201 and the third lower surface 202 of the supporting member 200, and extend to the connecting portions 51 on the third lower surface 202 side of the supporting member 200.

At least a portion of each of the electrodes 26 of the light-emitting device 20A is disposed on a respective one of the connecting members 61. Each of the connecting members 61 is electroconductive and electrically connect a respective one of the electrodes 26 of the light-emitting device 20A to a respective one of the connecting portions 51. Electricity is supplied from an external circuit to the light-emitting device 20A through the wiring layer and the connecting portions 51 of the wiring board 50, the connecting members 61, and the electrodes 26.

For example, the connecting members 61 are formed by curing electroconductive paste in which an electroconductive filler is dispersed in a binder resin. For the filler, the connecting members 61 can contain, for example, a metal such as copper and silver. The filler is particulate or flaky.

A pair of connecting members 61 are disposed corresponding to the positive and negative electrodes 26, and the connecting member 61 connected to the positive electrode 26 and the connecting member 61 connected to the negative electrode 26 are disposed apart from each other and are not electrically connected together. An insulating film 53 is disposed on the lower surface of the insulating film 52 to cover the connecting members 61. The insulating film 53 covers the region between the pair of connecting members 61 to enhance the insulation performance between the pair of connecting members 61.

The second lower surface 22b of the resin member 22 of the light-emitting device 20A and the grooves 25 located in the second lower surface 22b face the third upper surface 201 of the supporting member 200. A portion of each of the grooves 25 faces a respective one of the first hole portions 210 of the supporting member 200. Also, a portion of each of the connecting members 61 is disposed inside a respective one of the grooves 25.

In the surface light source 300 of the first embodiment having a structure as described above, light that has been guided inside the light-guiding plate 10 and traveled toward the second main surface 12 is reflected at the light-reflective sheet 42 toward the first main surface 11, which is the light-exiting surface, of the surface light source 300, so that the luminance of light extracted from the first main surface 11 can be enhanced.

In the region between the light-reflective sheet 42 and the first main surface 11, light emitted from the light-emitting device 20A is guided toward the dividing grooves 14 through the light-guiding plate 10 while total reflection is repeated between the light-reflective sheet 42 and the first main surface 11. A portion of light traveling toward the first main surface 11 is extracted from the first main surface 11 to the outside of the light-guiding plate 10.

Subsequently, a method of manufacturing the surface light source 300 will be described referring to FIG. 4A to FIG. 5K.

The method of manufacturing the surface light source 300 includes a step of providing the light-emitting device 20A. FIG. 4A to FIG. 4J are schematic cross-sectional views illustrating the step of providing the light-emitting device 20A.

Figure 4A:
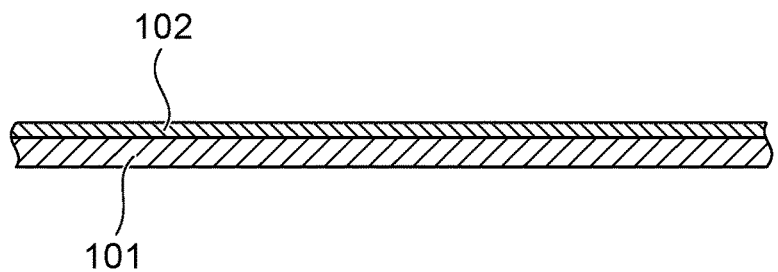
FIG. 4A is a schematic cross-sectional view illustrating a method of manufacturing the light-emitting device of the first embodiment of the present invention.
Figure 4B:
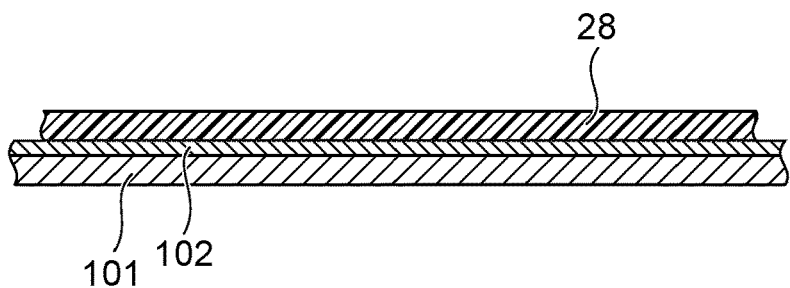
FIG. 4B is a schematic cross-sectional view illustrating the method of manufacturing the light-emitting device of the first embodiment of the present invention.
Figure 4C:
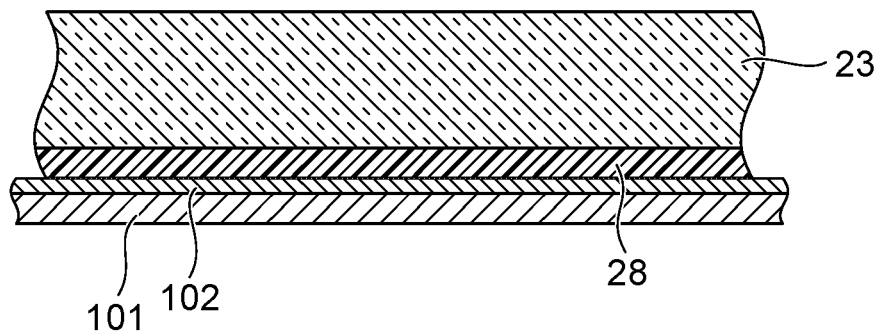
FIG. 4C is a schematic cross-sectional view illustrating the method of manufacturing the light-emitting device of the first embodiment of the present invention.
Figure 4D:
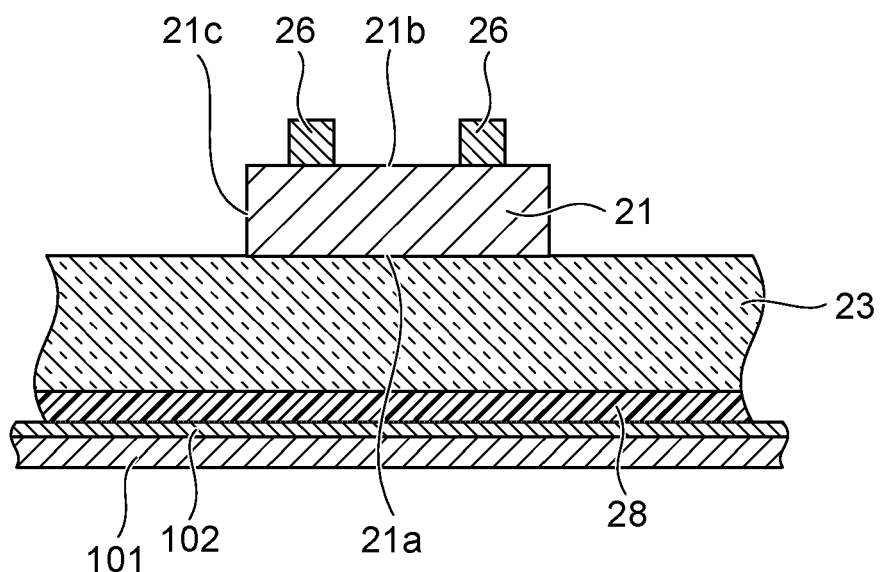
FIG. 4D is a schematic cross-sectional view illustrating the method of manufacturing the light-emitting device of the first embodiment of the present invention.

A supporting plate 101 is provided as shown in FIG. 4A. An adhesive tape 102 is disposed on the upper surface of the supporting plate 101. The first light adjusting member 28 is disposed on the adhesive tape 102 as shown in FIG. 4B. The first resin portion 23 is disposed on the first light adjusting member 28 as shown in FIG. 4C. The light-emitting element 21 is disposed on the first resin portion 23 as shown in FIG. 4D. The first upper surface 21a of the light-emitting element 21 is in contact with the first resin portion 23. The electrodes 26 are located on the first lower surface 21b of the light-emitting element 21.

Figure 4E:
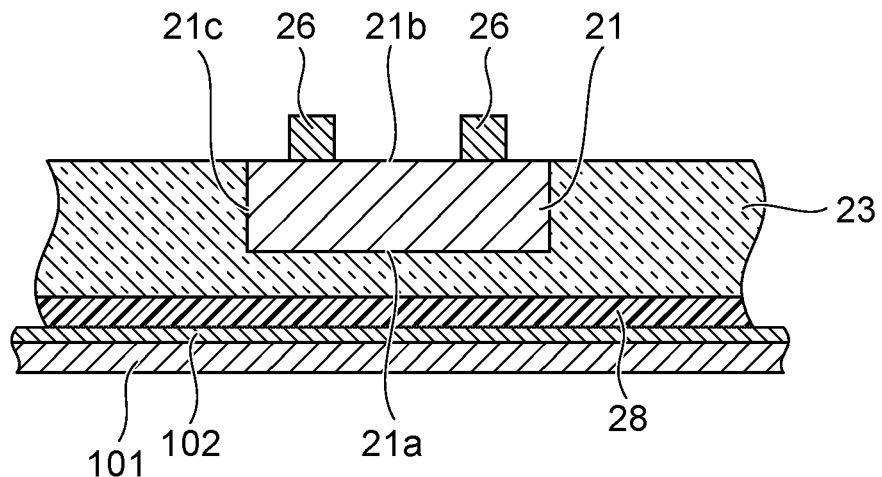
FIG. 4E is a schematic cross-sectional view illustrating the method of manufacturing the light-emitting device of the first embodiment of the present invention.

The first resin portion 23 is not completely cured yet when the light-emitting element 21 is placed on the first resin portion 23. The light-emitting element 21 is pressed into the first resin portion 23 in this state, which causes the first resin portion 23 to cover the first upper surface 21a and the first lateral surfaces 21c of the light-emitting element 21 as shown in FIG. 4E. The first lower surface 21b and the electrodes 26 of the light-emitting element 21 are exposed from the first resin portion 23.

Figure 4F:
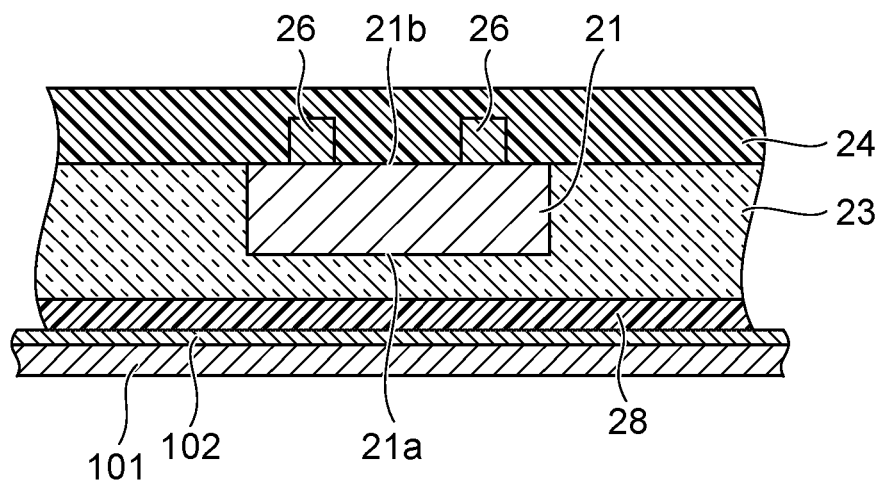
FIG. 4F is a schematic cross-sectional view illustrating the method of manufacturing the light-emitting device of the first embodiment of the present invention.
Figure 4G:
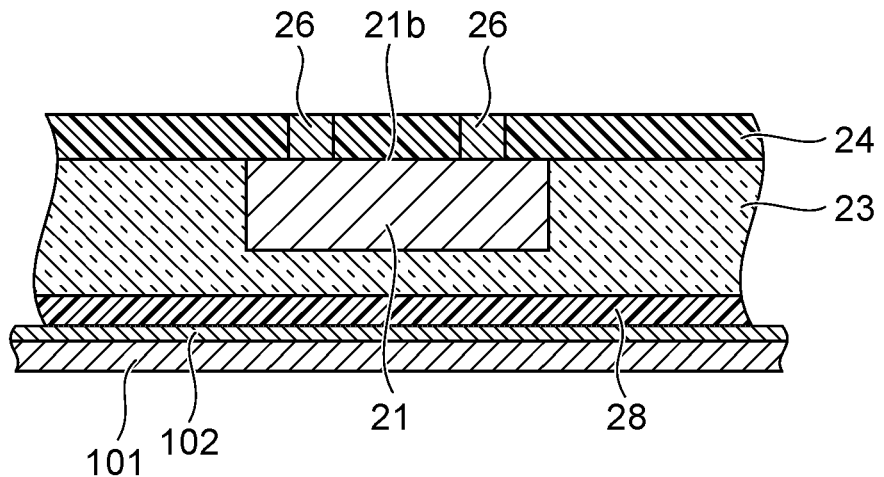
FIG. 4G is a schematic cross-sectional view illustrating the method of manufacturing the light-emitting device of the first embodiment of the present invention.

Subsequently, the second resin portion 24 is disposed on the first resin portion 23 and on the first lower surface 21b of the light-emitting element 21 to cover the electrodes 26 as shown in FIG. 4F. The upper surface of the second resin portion 24 is ground to expose surfaces of the electrodes 26 (surfaces of the electrodes 26 that will face the first holes 210 of the supporting member 200 in the subsequent step) from the second resin portion 24 as shown in FIG. 4G.

Figure 4H:
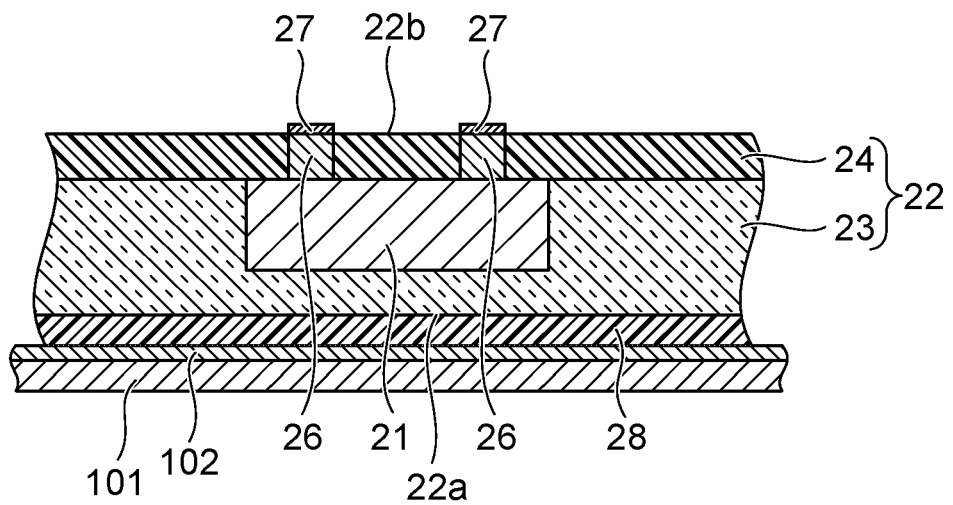
FIG. 4H is a schematic cross-sectional view illustrating the method of manufacturing the light-emitting device of the first embodiment of the present invention.

When necessary, the metal films 27 are disposed on the exposed surfaces of the electrodes 26 as shown in FIG. 4H. For example, a Ni film and an Au film are formed in order on a surface made of Cu of each of the electrodes 26 by sputtering to form the metal films 27.

The second upper surface 22a of the resin member 22, which includes the first resin portion 23 and the second resin portion 24, faces the supporting plate 101, and the second lower surface 22b of the resin member 22 opposite to the second upper surface 22a is an exposed surface facing upward.

Figure 4I:
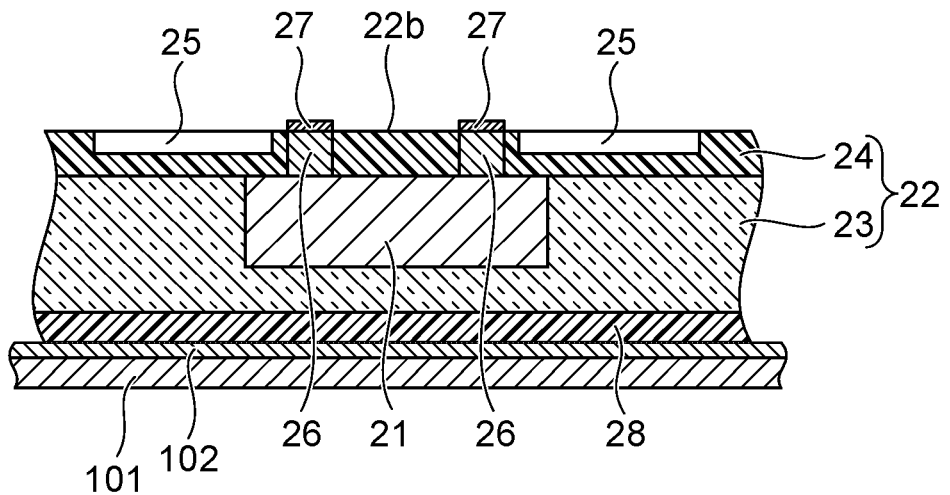
FIG. 4I is a schematic cross-sectional view illustrating the method of manufacturing the light-emitting device of the first embodiment of the present invention.

The grooves 25 are formed in the second lower surface 22b of the resin member 22 as shown in FIG. 4I. The grooves 25 are located apart from the electrodes 26 and are not in contact with the electrodes 26. The grooves 25 are located apart from the metal films 27 and are not in contact with the metal films 27.

For example, the grooves 25 are formed by irradiating the second lower surface 22b with laser light and etching the second resin portion 24. With the electrodes 26 or the metal films 27 that are not in contact with the grooves 25, the laser light is not irradiated to the electrodes 26 or the metal films 27. Accordingly, damage to the electrodes 26 or the metal films 27 that may be caused by irradiation with the laser light can be prevented.

Figure 4J:
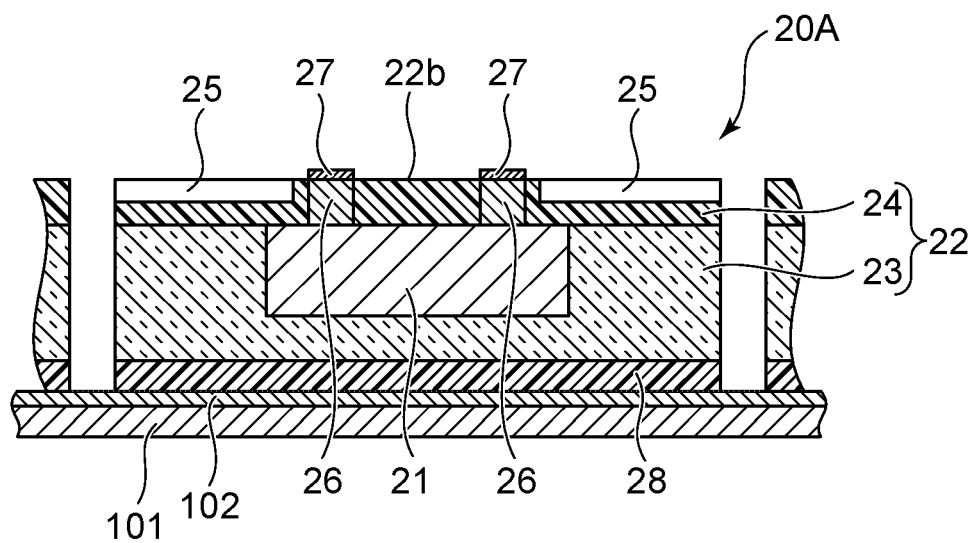
FIG. 4J is a schematic cross-sectional view illustrating the method of manufacturing the light-emitting device of the first embodiment of the present invention.

In the step shown in FIG. 4D, a plurality of light-emitting elements 21 are disposed on the first resin portion 23, and in the step shown in FIG. 4E, the light-emitting elements 21 are pressed into the first resin portion 23. After the grooves 25 are formed, the resin member 22 and the first light adjusting member 28 are cut at locations surrounding at least one of the light-emitting elements 21, the cutting performed in the thickness direction of the resin member 22 and the first light adjusting member 28. This allows for obtaining singulated light-emitting devices 20A as shown in FIG. 4J. When cutting is performed at a position where the groove 25 has been formed, an end of the grooves 25 is located at the cut surface. Accordingly, in a single light-emitting device 20A, the grooves 25 each extending from at a position apart from a respective electrode 26 to a corresponding outer edge of the second lower surface 22b of the resin member 22 can be obtained.

Figure 5A:
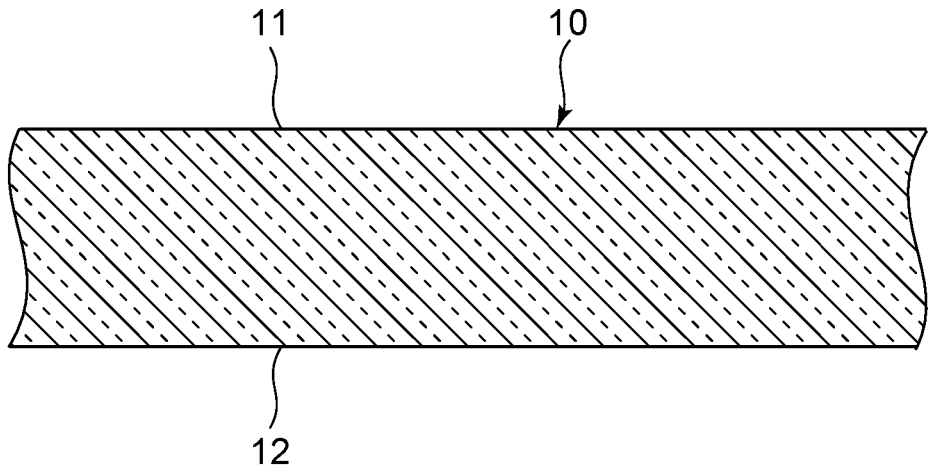
FIG. 5A is a schematic cross-sectional view illustrating a method of manufacturing the surface light source of the first embodiment of the present invention.

The method of manufacturing the surface light source 300 further includes a step of providing the light-guiding plate 10 as shown in FIG. 5A. The light-guiding plate 10 has the first main surface 11 and the second main surface 12 opposite to the first main surface 11.

Figure 5B:
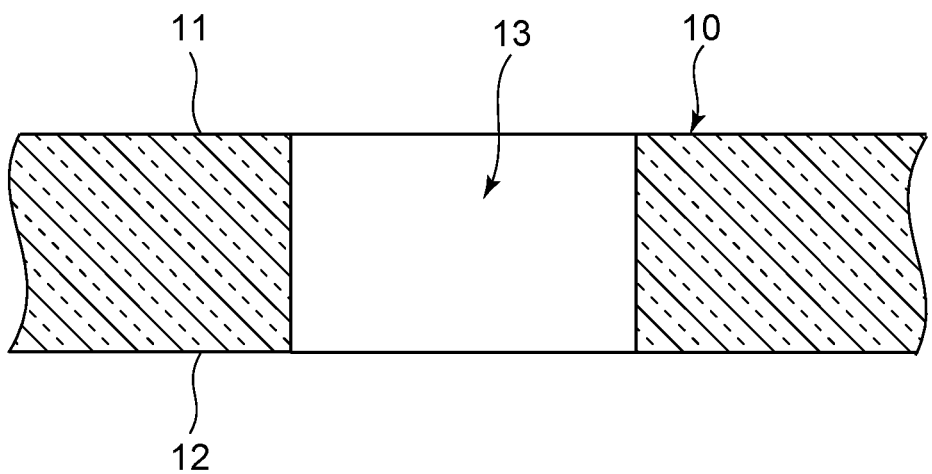
FIG. 5B is a schematic cross-sectional view illustrating the method of manufacturing the surface light source of the first embodiment of the present invention.

The second hole 13 is formed in the light-guiding plate 10 as shown in FIG. 5B. For example, the second hole 13 can be formed by drilling, punching, or laser machining to serve as a through hole extending through the first main surface 11 and the second main surface 12. The light-guiding plate 10 having the second hole 13 may be provided by purchasing.

Figure 5C:
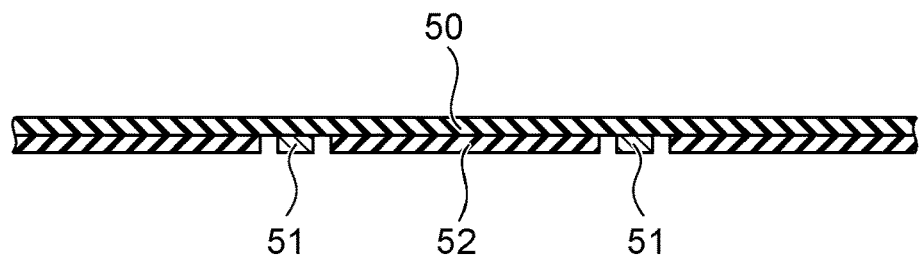
FIG. 5C is a schematic cross-sectional view illustrating the method of manufacturing the surface light source of the first embodiment of the present invention.

The method of manufacturing the surface light source 300 further includes a step of providing the supporting member 200. The step of providing the supporting member 200 includes providing the wiring board 50 as shown in FIG. 5C. The connecting portions 51 of the wiring layer and the insulating film 52 are disposed on the lower surface of the wiring board 50. The connecting portions 51 are disposed in the opening defined in the insulating film 52 to be exposed from the insulating film 52.

Figure 5D:
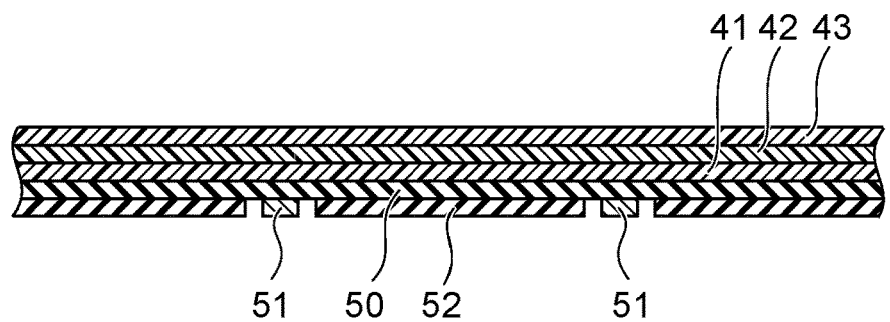
FIG. 5D is a schematic cross-sectional view illustrating the method of manufacturing the surface light source of the first embodiment of the present invention.

The first adhesive member 41, the light-reflective sheet 42, and the second adhesive member 43 are layered on the upper surface of the wiring board 50 as shown in FIG. 5D.

Figure 5E:
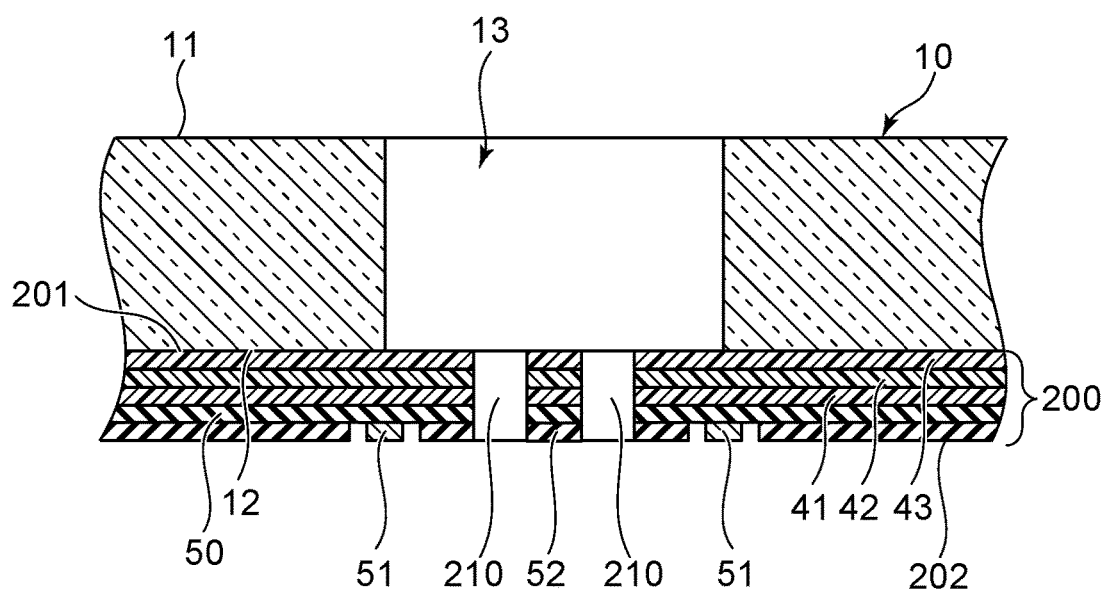
FIG. 5E is a schematic cross-sectional view illustrating the method of manufacturing the surface light source of the first embodiment of the present invention.

As shown in FIG. 5E, the first holes 210 running through the second adhesive member 43, the light-reflective sheet 42, the first adhesive member 41, the wiring board 50, and the insulating film 52 are formed, so that the supporting member 200 can obtained. For example, the first holes 210 can be formed by punching, drilling, or laser machining. The first holes 210 are circular in a plan view. The first holes 210 may not be circular but elliptic or polygonal in a plan view. The supporting member 200 may be provided by purchasing.

The light-guiding plate 10 is disposed on the supporting member 200. The second main surface 12 of the light-guiding plate 10 faces the upper surface of the second adhesive member 43 serving as the third upper surface 201 of the supporting member 200 and is bonded to the upper surface of the second adhesive member 43.

The first holes 210 formed in the supporting member 200 overlap with the second hole 13 formed in the light-guiding plate 10 and communicate with the second hole 13. Two first holes 210 overlap with a single second hole 13.

Figure 5F:
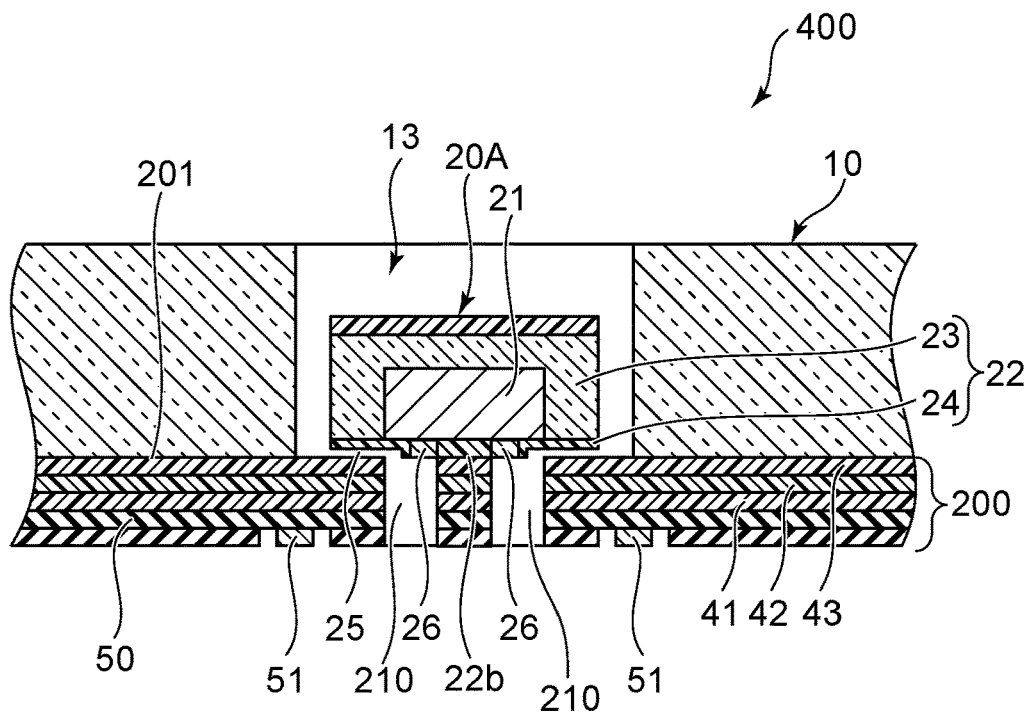
FIG. 5F is a schematic cross-sectional view illustrating the method of manufacturing the surface light source of the first embodiment of the present invention.

After the light-guiding plate 10 is disposed on the supporting member 200, the light-emitting device 20A is disposed inside the second hole 13 of the light-guiding plate 10 as shown in FIG. 5F. The second lower surface 22b of the resin member 22 of the light-emitting device 20A is bonded to the upper surface of the second adhesive member 43 exposed inside the second hole 13.

The electrodes 26 of the light-emitting device 20A are aligned with the first holes 210 defined in the supporting member 200. At least a portion of each of the lower surfaces of the electrodes 26 faces a respective one of the first holes 210. One of the first holes 210 faces one of the pair of positive and negative electrodes 26, and the other of the first holes 210 faces the other of the pair of positive and negative electrodes 26.

A portion of each of the grooves 25 formed in the second lower surface 22b of the resin member 22 faces the third upper surface 201 of the supporting member 200, and another portion of each of the grooves 25 faces the first hole 210. An end of each groove 25 communicates with a respective first hole 210 formed in the supporting member 200, and the other end of each groove 25 communicates with the second hole 13 formed in the light-guiding plate 10. Each first hole 210 and the second hole 13 communicate with each other via the grooves 25.

The light-emitting device 20A is disposed on the supporting member 200, so that a structure body 400 shown in FIG. 5F can be obtained. Electroconductive paste is supplied to the first holes 210 of the structure body 400. The electroconductive paste is supplied to the first holes 210 by, for example, printing or dispensing while the first holes 210 are evacuated from the second hole 13 side through the grooves 25.

Figure 5G:
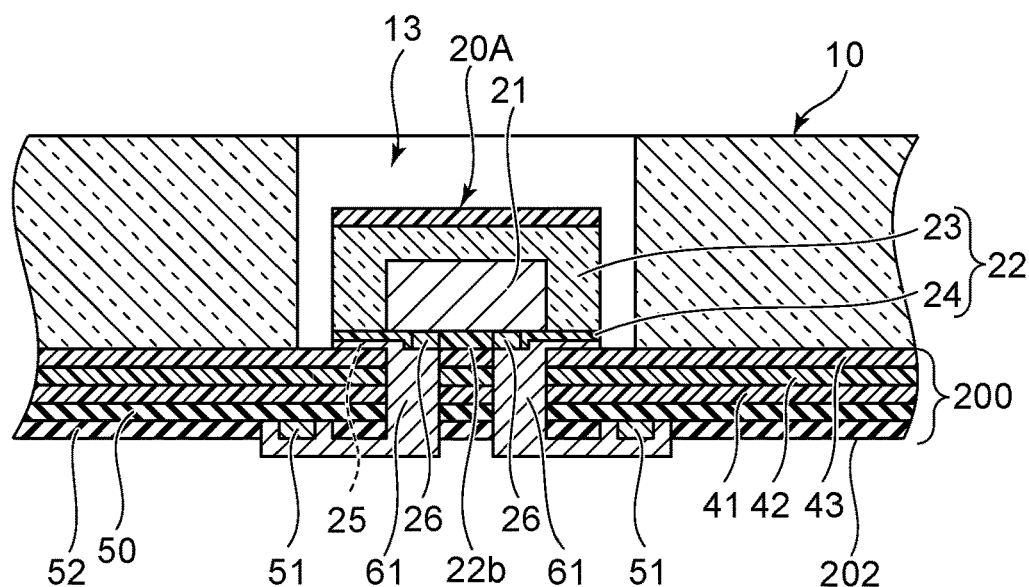
FIG. 5G is a schematic cross-sectional view illustrating the method of manufacturing the surface light source of the first embodiment of the present invention.

For example, the electroconductive paste is supplied into the first holes 210 and is cured by heat, so that the connecting members 61 connected to the electrodes 26 of the light-emitting device 20A can be formed as shown in FIG. 5G. For example, the heating temperature at this time is 100° C. or greater and 120° C. or less, and the heating time is 0.5 hours or more and 1 hour or less. After the electroconductive paste is supplied to the first holes 210, the electroconductive paste may be cured under a pressure of 5 atmosphere or more and 10 or less atmosphere. The electroconductive paste is also supplied to the third lower surface 202 side of the supporting member 200, so that the connecting members 61 are formed on the third lower surface 202 side to be connected to the connecting portions 51 of the wiring layer. Accordingly, each of the connecting members 61 electrically connects a respective one of the electrodes 26 of the light-emitting device 20A to a respective one of the connecting portions 51 of the wiring board 50.

By supplying the electroconductive paste to the first holes 210 while the first holes 210 are evacuated from the second hole 13 side through the grooves 25, air inside the first holes 210 can escape to the second hole 13 through the grooves 25. This allows the connecting members 61 to be charged into the first holes 210 while reducing voids, so that reliability of electrical connections between the light-emitting device 20A and the wiring board 50 through the connecting members 61 can be enhanced.

The electroconductive paste supplied to the first holes 210 also reaches the grooves 25 due to the negative pressure on the second hole 13 side. Accordingly, the connecting members 61 also include portions located in the grooves 25. Due to a difference in flow resistance between the air and the electroconductive paste, while the air escapes to the second hole portion 13 through the grooves 25, the width and depth of the grooves 25 are determined such that the electroconductive paste does not flow into the second hole portion 13 from the grooves 25.

If the grooves 25 are blocked by the electroconductive paste before the electroconductive paste is filled into the first holes 210, the air inside the first holes 210 can not escape to the second hole 13 through the grooves 25. The depth of the grooves 25 is preferably larger than the thickness of the second adhesive member 43 to which the light-emitting device 20A is bonded so that that the grooves 25 are not blocked by the electroconductive paste in an early stage of the supply of the electroconductive paste. When the aspect ratio of the grooves 25 is defined as the ratio of the depth of the grooves 25 to the width in a direction orthogonal to the direction of extension of the grooves 25, the aspect ratio of the grooves 25 is preferably one or greater and three or less.

Figure 5H:
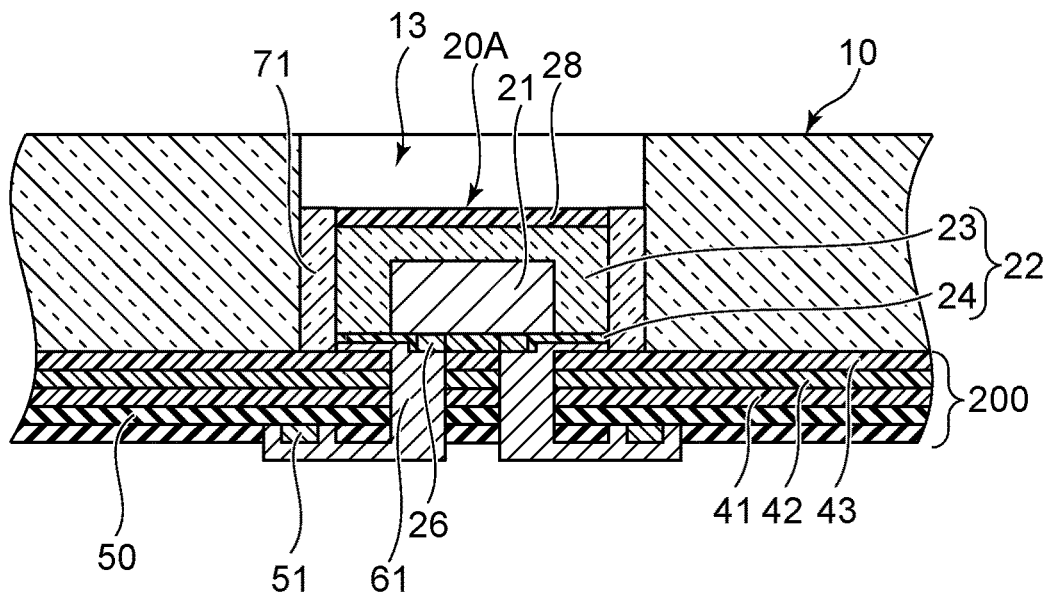
FIG. 5H is a schematic cross-sectional view illustrating the method of manufacturing the surface light source of the first embodiment of the present invention.

After the connecting members 61 are formed, the first light-transmissive member 71 is formed inside the second hole 13 of the light-guiding plate 10 as shown in FIG. 5H. The first light-transmissive member 71 is formed between each lateral surface of the light-emitting device 20A and a respective lateral surface of the second hole 13. The upper surface of the light-emitting device 20A is exposed from the first light-transmissive member 71. For example, a light-transmissive resin in a liquid state is supplied to the second hole 13 and is cured by heat, so that the first light-transmissive member 71 is formed. For example, the heating temperature at this time is 100° C. or greater and 120° C. or less, and the heating time is 0.5 hours or more and 1 hour or less. The light-emitting device 20A is fixed to the light-guiding plate 10 using the first light-transmissive member 71.

Figure 5I:
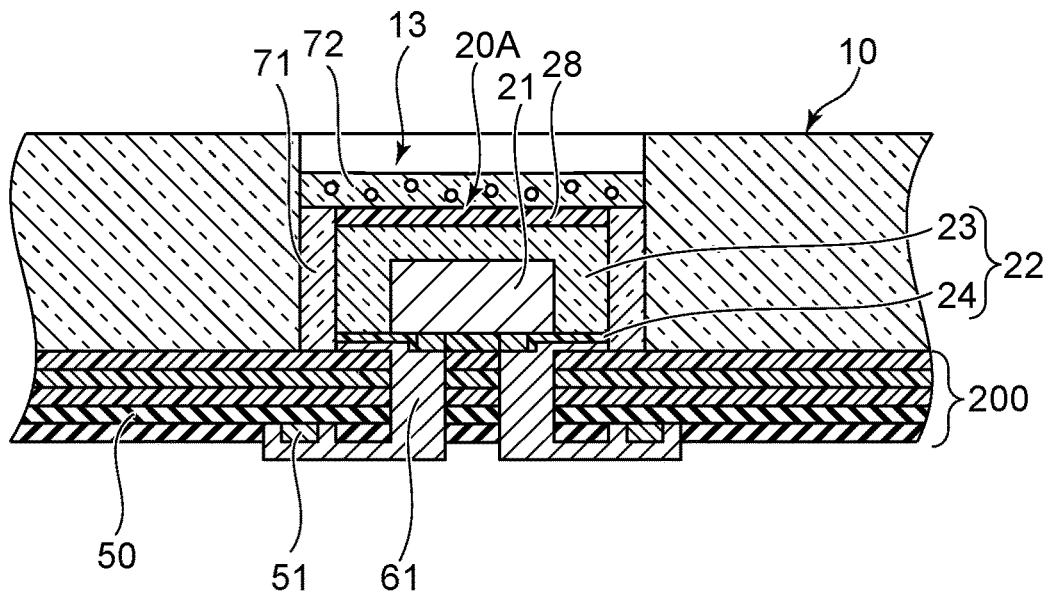
FIG. 5I is a schematic cross-sectional view illustrating the method of manufacturing the surface light source of the first embodiment of the present invention.

After the first light-transmissive member 71 is formed, as shown in FIG. 5I, the wavelength conversion member 72 is formed over the light-emitting device 20A and the first light-transmissive member 71 inside the second hole 13. For example, a liquid resin containing a phosphor is supplied to the second hole 13 and is cured by heat, so that the wavelength conversion member 72 is formed. For example, the heating temperature at this time is 80° C. or greater and 120° C. or less, and the heating time is 5 minutes or more and 30 minutes or less.

Figure 5J:
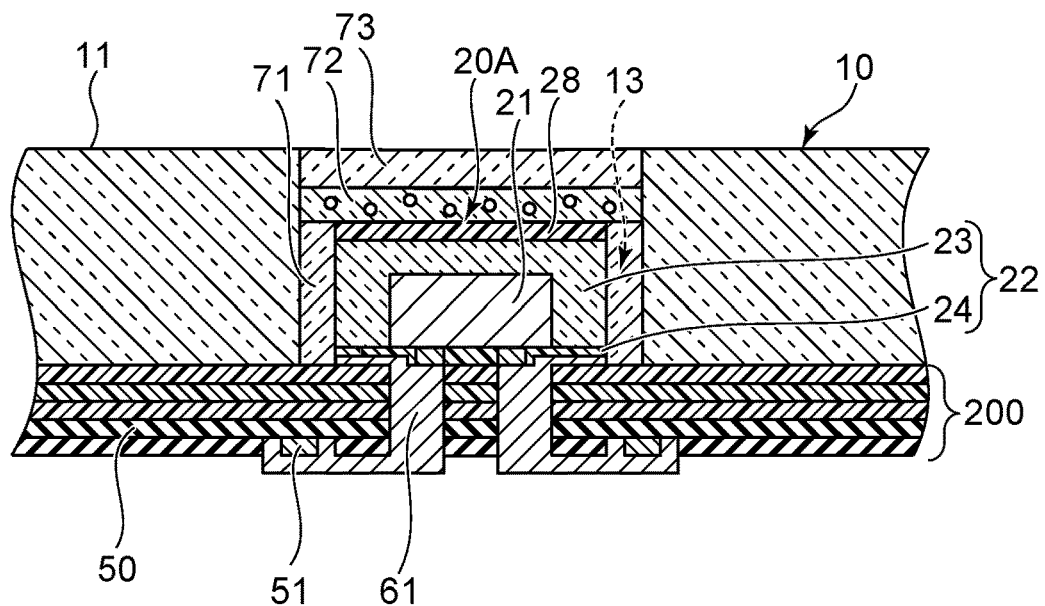
FIG. 5J is a schematic cross-sectional view illustrating the method of manufacturing the surface light source of the first embodiment of the present invention.

After the first wavelength conversion member 72 is formed, the second light-transmissive member 73 is formed over the wavelength conversion member 72 inside the second hole 13 as shown in FIG. 5J. For example, a liquid resin is supplied over the wavelength conversion member 72 and is cured by heat, so that the second light-transmissive member 73 is formed. For example, the heating temperature at this time is 80° C. or greater and 120° C. or less, and the heating time is 5 minutes or more and 30 minutes or less.

Figure 5K:
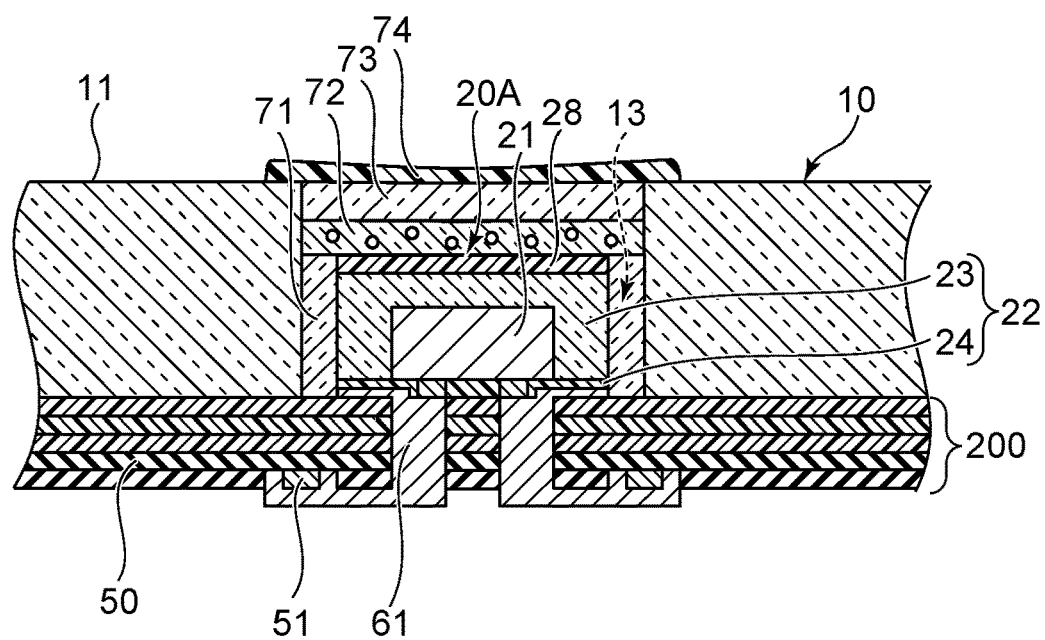
FIG. 5K is a schematic cross-sectional view illustrating the method of manufacturing the surface light source of the first embodiment of the present invention.

After the second light-transmissive member 73 is formed, the second light adjusting member 74 is formed over the second light-transmissive member 73 as shown in FIG. 5K. For example, a liquid resin containing a light-diffusing agent is supplied over the second light-transmissive member 73 and is cured by heat, so that the second light adjusting member 74 is formed. For example, the heating temperature at this time is 80° C. or greater and 120° C. or less, and the heating time is 5 minutes or more and 30 minutes or less.

After the second light adjusting member 74 is formed, the insulating film 53 is formed on the third lower surface 202 of the supporting member 200 to cover the connecting members 61 as shown in FIG. 3. For example, the insulating film 53 is formed by printing, potting, spraying, inkjet printing, or bonding of a resin sheet.

Second Embodiment

Figure 6A:
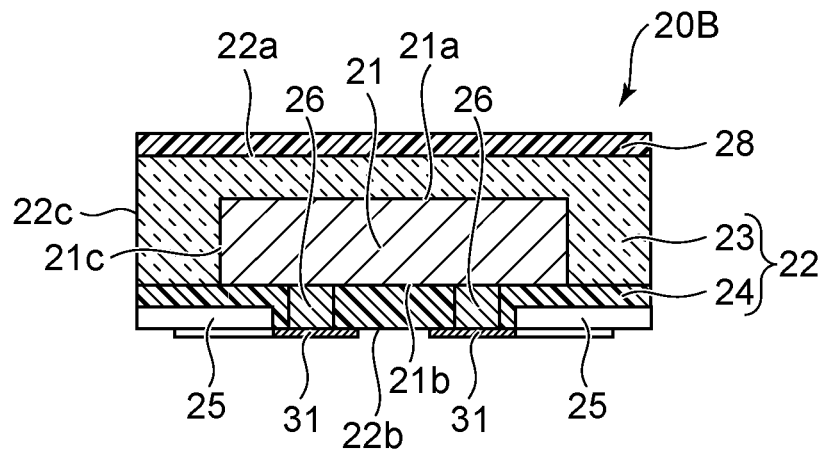
FIG. 6A is a schematic cross-sectional view of a light-emitting device of a second embodiment of the present invention.
Figure 6B:
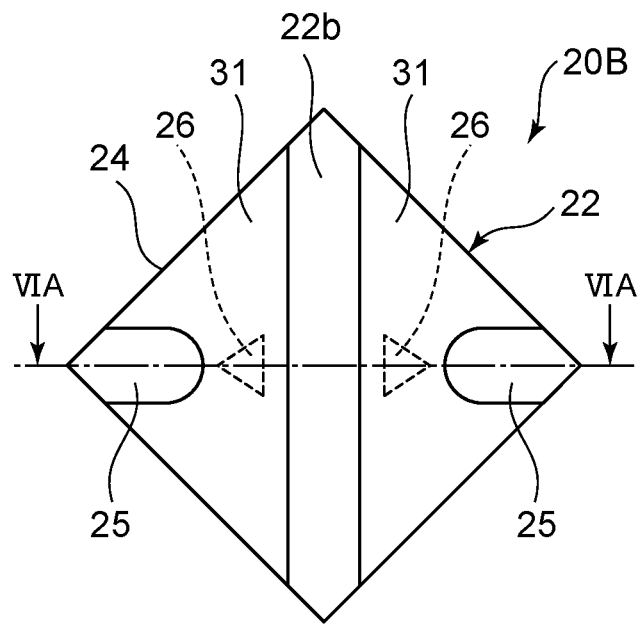
FIG. 6B is a schematic bottom view of the light-emitting device shown in FIG. 6A.

FIG. 6A is a schematic cross-sectional view of a light-emitting device 20B of a second embodiment of the present invention. FIG. 6B is a schematic bottom view of the light-emitting device 20B of the second embodiment. FIG. 6A is a schematic cross-sectional view taken along line VIA-VIA of FIG. 6B.

The light-emitting device 20B of the second embodiment includes the same configuration as the light-emitting device 20A of the first embodiment described above except for the metal films 27. The light-emitting device 20B of the second embodiment further includes electroconductive members 31.

The electroconductive members 31 are disposed on the second lower surface 22b of the resin member 22, and each electroconductive member 31 is connected to a portion of a respective one of the electrodes 26 exposed from the resin member 22. In the example shown in FIG. 6B, each of the electroconductive members 31 covers the entire lower surface of a respective one of the electrodes 26, and is in contact with the entire lower surfaces of the respective electrode 26. The electroconductive member 31 connected to one of the pair of positive and negative electrodes 26 is spaced apart from and electrically separated from the electroconductive member 31 connected to the other of the pair of positive and negative electrodes 26 on the second lower surface 22b.

Each electroconductive member 31 extends from the portion connected to the electrode 26 to at least a portion (except for portions located at the outer edge of the second lower surface 22b) of the edge of the groove 25. In the example shown in FIG. 6B, each electroconductive member 31 extends from the portion connected to the electrode 26 to the entire edge of a respective groove 25. The electroconductive member 31 surrounds the entire edge of the groove 25 in a plan view. The electroconductive member 31 is not disposed inside the groove 25. In other words, the base surface of the groove 25 defined by the second resin portion 24 is exposed from the electroconductive member 31 in a plan view.

For example, the electroconductive members 31 are formed by curing electroconductive paste in which an electroconductive filler is dispersed in a binder resin. The electroconductive members 31 can contain, for example, a metal such as copper or silver for the filler.

Figure 7:
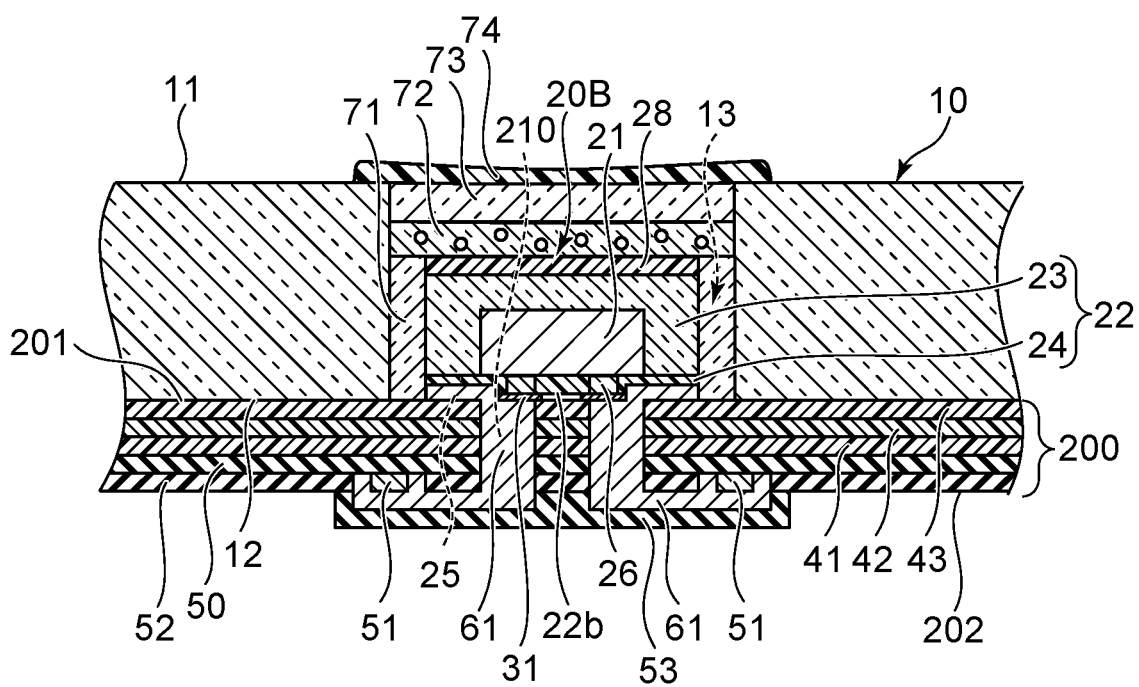
FIG. 7 is a schematic cross-sectional view of a surface light source of the second embodiment of the present invention.

FIG. 7 is a schematic cross-sectional view of the surface light source 300 including the light-emitting device 20B of the second embodiment.

In the second embodiment as well, the second lower surface 22b of the resin member 22 of the light-emitting device 20B and the grooves 25 defined in the second lower surface 22b face the third upper surface 201 of the supporting member 200. A portion of each of the grooves 25 faces a respective one of the first holes 210 of the supporting member 200. A portion of each of the connecting members 61 is also located inside a respective one of the grooves 25.

A portion of each of the electroconductive members 31 disposed on the second lower surface 22b of the resin member 22 faces a respective first hole 210 of the supporting member 200, and a portion of each connecting member 61 is in contact with the a respective electroconductive member 31.

In the second embodiment as well as in the first embodiment, by supplying the electroconductive paste to the first holes 210 while the first holes 210 are evacuated from the second hole 13 side of the light-guiding plate 10 through the grooves 25, air inside the first holes 210 can escape to the second hole 13 through the grooves 25. This allows the connecting members 61 to be charged into the first holes 210 while reducing voids, so that reliability of electrical connections between the light-emitting device 20B and the wiring board 50 through the connecting members 61 can be enhanced.

In the second embodiment, each of the electroconductive members 31 is connected to a respective one of the electrodes 26 and extends to an edge of a respective one of the grooves 25 on the second lower surface 22b of the resin member 22. The electroconductive paste supplied into the grooves 25 can protrude outward of the edges of the grooves 25 and can be in contact with the electroconductive members 31. For example, even if the electroconductive paste is disposed predominantly on the groove 25 side due to the negative pressure applied from the second hole 13 side and fails to be supplied to positions directly below and in contact with the electrodes 26, the connecting members 61 can be in contact with the electroconductive members 31 at positions near the grooves 25. This allows the electrodes 26 to be electrically connected to the connecting member 61 via the electroconductive members 31. The second embodiment as described above allows for higher reliability of the electrical connection between the light-emitting device 20B and the wiring board 50 than in the first embodiment.

Figure 8A:
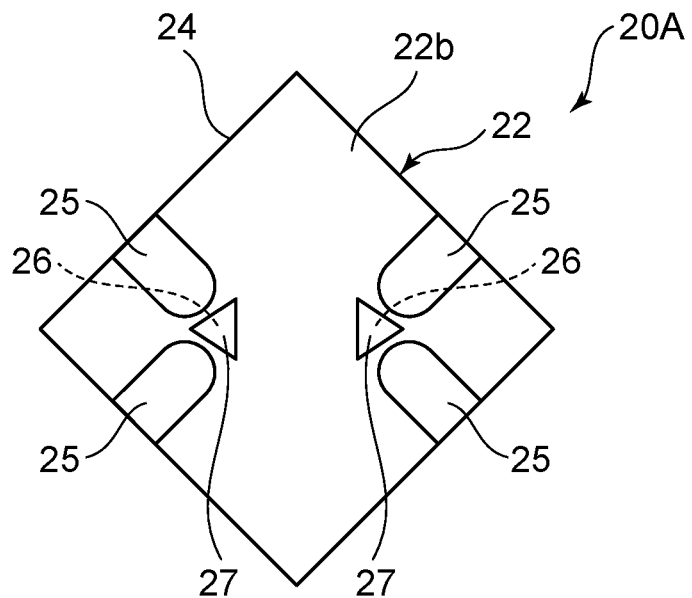
FIG. 8A is a schematic bottom view of the light-emitting device of the first embodiment of the present invention.
Figure 8B:
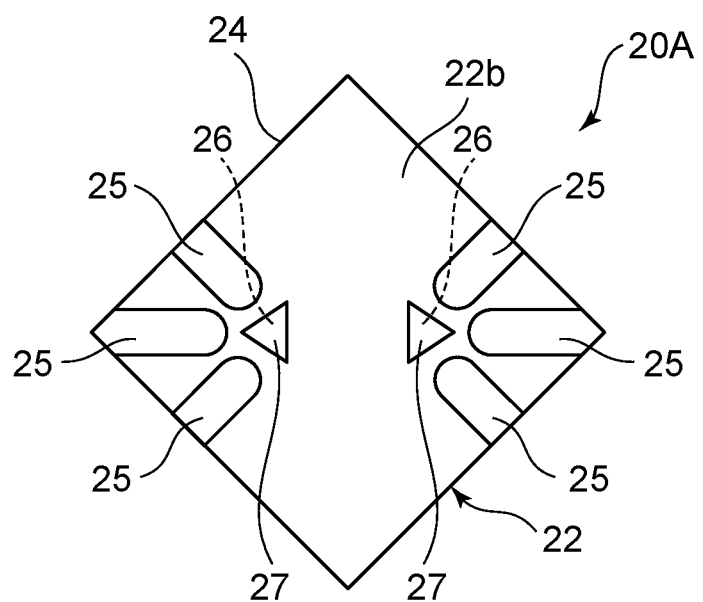
FIG. 8B is a schematic bottom view of the light-emitting device of the first embodiment of the present invention.
Figure 8C:
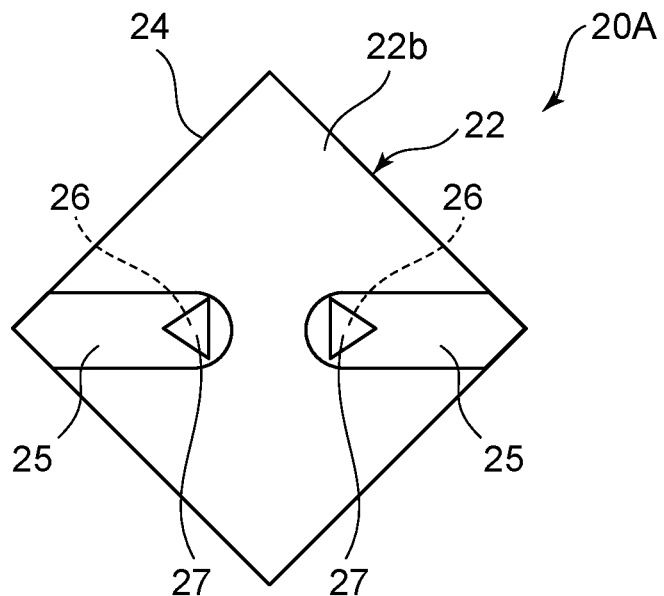
FIG. 8C is a schematic bottom view of the light-emitting device of the first embodiment of the present invention.

FIG. 8A to FIG. 8C schematically show other examples of the lower surface of the light-emitting device 20A of the first embodiment. A plurality of grooves 25 can correspond to a single electrode 26. In FIG. 8A, two grooves 25 correspond to a single electrode 26. In FIG. 8B, three grooves 25 correspond to a single electrode 26. Alternatively, four or more grooves 25 may correspond to a single electrode 26.

In the example shown in FIG. 8A, the distance of extension of the grooves 25 from positions apart from the electrodes 26 to the outer edge of the second lower surface 22b of the resin member 22 is shorter than in the example shown in FIG. 1B, which can facilitate air to escape through the grooves 25 when the electroconductive paste is supplied to the first holes 210 described above. The number of grooves 25 is larger than that in the example shown in FIG. 1B, which can facilitate air to escape through the grooves 25 when the electroconductive paste is supplied to the first holes 210.

In the example shown in FIG. 8B, the number of grooves 25 is larger than in the examples shown in FIG. 1B and FIG. 8A, which can more facilitate air to escape through the grooves 25 when the electroconductive paste is supplied to the first holes 210.

As shown in FIG. 8C, the electrodes 26 can be disposed inside the grooves 25. In this case as well, by supplying the electroconductive paste to the first holes 210 while the first holes 210 are evacuated from the second hole 13 side of the light-guiding plate 10 through the grooves 25, air inside the first holes 210 can escape to the second hole 13 through the grooves 25.

The grooves 25 are longer in the example shown in FIG. 8C than in the example shown in FIG. 1B, so that the electroconductive paste is less likely to leak from the grooves 25 into the second hole 13 even if the electroconductive paste has a low viscosity. Further, the electrodes 26 are located inside the grooves 25, which allows for securing the electrical connections between the electroconductive paste supplied to each groove 25 and a respective electrode 26.

Figure 9A:
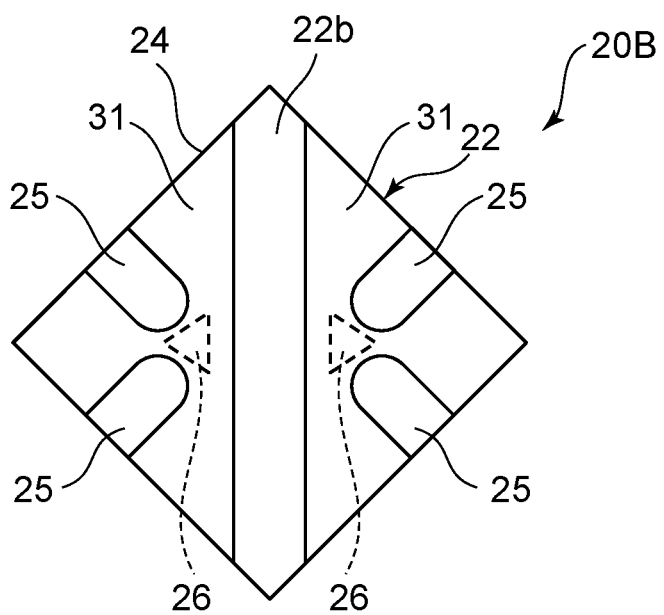
FIG. 9A is a schematic bottom view of the light-emitting device of the second embodiment of the present invention.
Figure 9B:
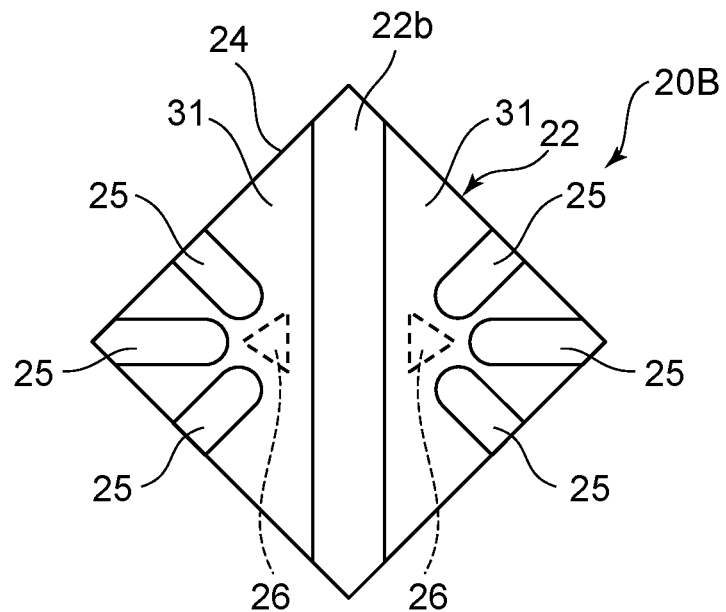
FIG. 9B is a schematic bottom view of the light-emitting device of the second embodiment of the present invention.
Figure 9C:
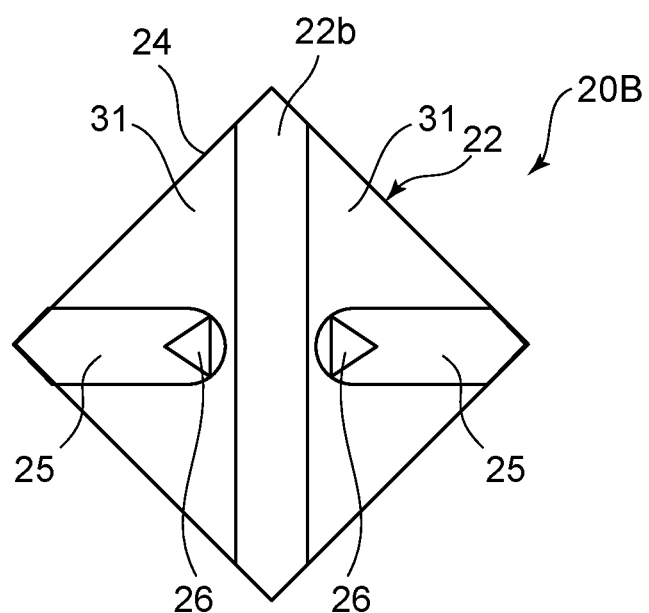
FIG. 9C is a schematic bottom view of the light-emitting device of the second embodiment of the present invention.

FIG. 9A to FIG. 9C schematically show other examples of the lower surface of the light-emitting device 20B of the second embodiment. In the second embodiment as well, a plurality of grooves 25 can correspond to a single electrode 26. In FIG. 9A, two grooves 25 correspond to a single electrode 26. In FIG. 9B, three grooves 25 correspond to a single electrode 26. In the second embodiment as well, four or more grooves 25 may correspond to a single electrode 26.

In the example shown in FIG. 9A, the distance of extension of the grooves 25 from positions apart from the electrodes 26 to respective corresponding outer edges of the second lower surface 22b of the resin member 22 is shorter than in the example shown in FIG. 6B, which can facilitate air to escape through the grooves 25 when the electroconductive paste is supplied to the first holes 210. Also, in the example shown in FIG. 9A, the number of grooves 25 is larger than in the example shown in FIG. 6B, which can facilitate air to escape through the grooves 25 when the electroconductive paste is supplied to the first holes 210.

In the example shown in FIG. 9B, the number of grooves 25 is larger than in the examples shown in FIG. 6B and FIG. 9A, which can further facilitate air to escape through the grooves 25 when the electroconductive paste is supplied to the first holes 210.

The grooves 25 are longer in the example shown in FIG. 9C than in the example shown in FIG. 6B, so that the electroconductive paste is less likely to leak from the grooves 25 into the second hole 13 even if the electroconductive paste has a low viscosity.

In the second embodiment as well, the electrodes 26 can be disposed inside the grooves 25 as shown in FIG. 9C.

In the description above, certain embodiments of the present invention are described. However, the present invention is not limited the embodiments described above, and should be broadly construed on the basis of the claims. The present invention also encompasses variations and modifications that are made on the basis of the description above.

What is claimed is:

1. A light-emitting device comprising:
a light-emitting element having an upper surface, a lower surface opposite to the upper surface, and lateral surfaces between the upper surface and the lower surface;
a plurality of electrodes electrically connected to the light-emitting element and disposed on the lower surface of the light-emitting element; and
a resin member covering the upper surface, the lower surface, and the lateral surfaces of the light-emitting element, the resin member having an upper surface, a lower surface opposite to the upper surface, and lateral surfaces between the upper surface and the lower surface;
wherein a portion of each of the electrodes is exposed at the lower surface of the resin member; and
wherein a plurality of grooves are defined in the lower surface of the resin member, each of the grooves extending from a position under the lower surface of the light-emitting element and apart from the electrode to an outer edge of the lower surface of the resin member.

2. The light-emitting device according to claim 1, wherein:
the resin member comprises a light-reflective portion constituting the lower surface of the resin member.

3. The light-emitting device according to claim 1, further comprising:
a plurality of electroconductive members disposed on the lower surface of the resin member, each of the electroconductive members being connected to the portion of a respective one of the electrodes that is exposed from the resin member;
wherein each of the electroconductive members extends from the portion of the respective electrode to an edge of a respective one of the grooves.

4. The light-emitting device according to claim 1, wherein:
the outer edge of the lower surface of the resin member has a corner, and
in a plan view of the lower surface of the resin member, one of the plurality of grooves overlaps the corner.

5. The light-emitting device according to claim 1, wherein:
the lower surface of the resin member has a quadrangular shape including a first corner, a second corner opposite to the first corner, a third corner, and a fourth corner opposite to the third corner, and
in a plan view of the lower surface of the resin member, the first corner overlaps one of the plurality of grooves, the second corner overlaps another one of the plurality of grooves, and the third corner and the fourth corner are apart from the plurality of grooves.

6. The light-emitting device according to claim 1, wherein the plurality of grooves are disposed only below the upper surface of the light-emitting element.

7. The light-emitting device according to claim 1, wherein the plurality of grooves are disposed only below the lower surface of the light-emitting element.

8. The light-emitting device according to claim 1, wherein:
the lower surface of the resin member has a quadrangular shape including a first corner, a second corner opposite to the first corner, a third corner, and a fourth corner opposite to the third corner,
in a plan view of the lower surface of the resin member, the first corner overlaps one of the plurality of grooves, the second corner overlaps another one of the plurality of grooves, and the third corner and the fourth corner are apart from the plurality of grooves, and
the plurality of grooves are disposed only below the lower surface of the light-emitting element.

9. A surface light source comprising:
a plurality of light-emitting devices, each comprising:
a light-emitting element having an upper surface, a lower surface opposite to the upper surface, and lateral surfaces between the upper surface and the lower surface;
a plurality of electrodes electrically connected to the light-emitting element and disposed on the lower surface of the light-emitting element; and
a resin member covering the upper surface, the lower surface, and the lateral surfaces of the light-emitting element, the resin member having an upper surface, a lower surface opposite to the upper surface, and lateral surfaces between the upper surface and the lower surface;
wherein a portion of each of the electrodes is exposed at the lower surface of the resin member; and
wherein a plurality of grooves are defined in the lower surface of the resin member, each of the grooves extending from a position apart from the electrode to an outer edge of the lower surface of the resin member;
a supporting member defining a plurality of first holes and comprising a wiring layer;
a light-guiding plate having a first main surface and a second main surface opposite to the first main surface, the light-guiding plate defining a plurality of second holes, each accommodating a respective one of the light-emitting devices, the light-guiding plate being disposed on the supporting member such that the second main surface faces the supporting member; and
a plurality of connecting members, each disposed inside a respective one of the first holes of the supporting member to electrically connect the wiring layer and each of the electrodes of each light-emitting device;
wherein the lower surface of the resin member faces the supporting member; and
wherein a portion of each of the connecting members is disposed inside a respective one of the grooves.

10. The surface light source according to claim 9, wherein:
the connecting member contains a resin, and an electroconductive filler in the resin.

11. The surface light source according to claim 9, wherein:
the supporting member comprises:
a wiring board comprising the wiring layer, and
a light-reflective sheet disposed between the wiring board and the second main surface of the light-guiding plate and between the wiring board and the light-emitting device.

12. The surface light source according to claim 9, wherein:
the resin member comprises a light-reflective portion constituting the lower surface of the resin member.

13. The surface light source according to claim 9, further comprising:
a plurality of electroconductive members disposed on the lower surface of the resin member, each of the electroconductive members being connected to the portion of a respective one of the electrodes that is exposed from the resin member;
wherein each of the electroconductive members extends from the portion of the respective electrode to an edge of a respective one of the grooves.

14. The surface light source according to claim 9, wherein:
the outer edge of the lower surface of the resin member has a corner, and
in a plan view of the lower surface of the resin member, one of the plurality of grooves overlaps the corner.

15. The surface light source according to claim 9, wherein:
the lower surface of the resin member has a quadrangular shape including a first corner, a second corner opposite to the first corner, a third corner, and a fourth corner opposite to the third corner, and
in a plan view of the lower surface of the resin member, the first corner overlaps one of the plurality of grooves, the second corner overlaps another one of the plurality of grooves, and the third corner and the fourth corner are apart from the plurality of grooves.

16. The surface light source according to claim 9, wherein the plurality of grooves is disposed only below the upper surface of the light-emitting element.

17. The surface light source according to claim 9, wherein the plurality of grooves is disposed only below the lower surface of the light-emitting element.

18. A method of manufacturing a surface light source, the method comprising:
providing a structure body comprising:
a supporting member having an upper surface and a lower surface opposite to the upper surface, the supporting member defining a plurality of first holes that extend through the upper surface and the lower surface of the supporting member and comprising a wiring layer comprising a plurality of connecting portions at a lower surface side of the supporting member;
a light-guiding plate having a first main surface and a second main surface opposite to the first main surface, the light-guiding plate defining a plurality of second holes and disposed on the supporting member such that the second main surface faces the upper surface of the supporting member; and
a plurality of light-emitting devices, each comprising:
a light-emitting element having an upper surface, a lower surface opposite to the upper surface, and lateral surfaces between the upper surface and the lower surface,
a plurality of electrodes electrically connected to the light-emitting element and disposed on the lower surface of the light-emitting element, and
a resin member covering the upper surface, the lower surface, and the lateral surfaces of the light-emitting element, the resin member having an upper surface, a lower surface opposite to the upper surface, and lateral surfaces between the upper surface and the lower surface,
wherein a portion of each of the electrodes is exposed at the lower surface of the resin member, and
wherein a plurality of grooves are defined in the lower surface of the resin member, each of the grooves extending from a position apart from the electrode to an outer edge of the lower surface of the resin member;
wherein each light emitting device is disposed on the supporting member inside a respective one of the second holes such that the lower surface of the resin member faces the upper surface of the supporting member to allow each of the grooves to communicate with a respective one of the first holes and a corresponding one of the second holes; and
supplying connecting members through the first holes of the supporting member to reach the grooves to connect each of the connecting portions of the wiring layer to a respective one of the electrodes via a respective one of the connecting members.

19. The method of manufacturing a surface light source according to claim 18, wherein the connecting members are supplied to the first holes while the first holes are evacuated from a side of the second holes through the grooves.

20. The method of manufacturing a surface light source according to claim 19, wherein the connecting members comprise an electroconductive paste.

* * * * *